US012540060B2

(12) United States Patent
Kobayashi

(10) Patent No.: US 12,540,060 B2
(45) Date of Patent: Feb. 3, 2026

(54) OVERHEAD TRANSPORT VEHICLE AND TRANSPORT VEHICLE SYSTEM

(71) Applicant: Murata Machinery, Ltd., Kyoto (JP)

(72) Inventor: Makoto Kobayashi, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 365 days.

(21) Appl. No.: 18/036,914

(22) PCT Filed: Sep. 24, 2021

(86) PCT No.: PCT/JP2021/035167
§ 371 (c)(1),
(2) Date: May 15, 2023

(87) PCT Pub. No.: WO2022/107449
PCT Pub. Date: May 27, 2022

(65) Prior Publication Data
US 2024/0017973 A1    Jan. 18, 2024

(30) Foreign Application Priority Data

Nov. 18, 2020    (JP) .................................. 2020-191790

(51) Int. Cl.
*B66C 19/00*    (2006.01)
*B66C 13/22*    (2006.01)
(Continued)

(52) U.S. Cl.
CPC ................ *B66D 3/26* (2013.01); *B66C 13/22* (2013.01); *B66C 13/46* (2013.01); *B66C 13/48* (2013.01);
(Continued)

(58) Field of Classification Search
CPC .......... H01L 21/67733; H01L 21/6773; H01L 21/67259; H01L 21/68; H01L 21/6712;
(Continued)

(56) References Cited

U.S. PATENT DOCUMENTS 3,842,986 A * 10/1974 Hupkes ................... B66C 13/06
294/81.4
5,769,250 A *  6/1998 Jussila .................... B66C 13/08
294/81.4
(Continued)

FOREIGN PATENT DOCUMENTS

JP        H2-28401 A     1/1990
JP        H8-113310 A    5/1996
(Continued)

OTHER PUBLICATIONS

International Search Report dated Nov. 16, 2021 in counterpart International Application No. PCT/JP2021/035167 w/English translation.
(Continued)

*Primary Examiner* — Anna M Momper
*Assistant Examiner* — Henrix Soto
(74) *Attorney, Agent, or Firm* — DLA Piper LLP (US)

(57) ABSTRACT

The overhead transport vehicle includes: a winding drum configured to lift and lower a lifting part by winding and paying out a plurality of suspending members; at least one guide roller around which the suspending members paid out from the winding drum are wound; a body part supporting the winding drum and the guide roller; at least one position adjusting part configured to move a portion of each suspending member connected to the lifting part in a lifting direction by moving a relative position of the guide roller with respect to the body part; and a control part configured to control movement of the guide roller by the position adjusting part, based on information on an inclination of the lifting part.

12 Claims, 16 Drawing Sheets

(51) Int. Cl.
    *B66C 13/46*    (2006.01)
    *B66C 13/48*    (2006.01)
    *B66D 3/26*     (2006.01)
    *H01L 21/677*   (2006.01)
(52) U.S. Cl.
    CPC ........ B66C 19/00 (2013.01); H01L 21/67712 (2013.01); H01L 21/67733 (2013.01); *B66D 2700/026* (2013.01)
(58) Field of Classification Search
    CPC ........ H01L 21/67793; H01L 21/67796; G01B 11/26; G01B 11/27; B65G 1/0457; B65G 1/04; B65G 2201/02; B65G 2201/0297; B66C 11/00; B66C 11/06; B66C 19/00; B66C 13/08; B66C 13/085; B66C 13/06; B66C 13/063; B66C 13/10; B66C 13/18; B66C 13/23
    See application file for complete search history.

(56) References Cited

U.S. PATENT DOCUMENTS

| | | | | |
|---|---|---|---|---|
| 6,520,484 | B1 * | 2/2003 | Shimizu | B66D 1/50 254/276 |
| 6,921,061 | B2 * | 7/2005 | Hayashi | B66C 13/08 254/278 |
| 9,975,705 | B2 * | 5/2018 | Kinugawa | H01L 21/67727 |
| 10,427,919 | B2 * | 10/2019 | Rodríguez Mijangos | B66C 13/08 |
| 2003/0015489 | A1 * | 1/2003 | Uchida | B66C 13/46 212/326 |
| 2006/0180565 | A1 | 8/2006 | Nakao et al. | |
| 2016/0276191 | A1 * | 9/2016 | Kinugawa | H01L 21/67259 |
| 2020/0010307 | A1 * | 1/2020 | Gunji | B66C 13/06 |

FOREIGN PATENT DOCUMENTS

| | | | |
|---|---|---|---|
| JP | 10-194410 A | | 7/1998 |
| JP | H10194410 A | * | 7/1998 |
| JP | 2006-8355 A | | 1/2006 |
| JP | 2011-69671 A | | 4/2011 |
| JP | 2016-175723 A | | 10/2016 |
| JP | 2020-169090 A | | 10/2020 |
| KR | 10-2019-0135152 A | | 12/2019 |
| WO | WO-2015076443 A1 | * | 5/2015 ............ B66C 13/08 |

OTHER PUBLICATIONS

Written Opinion darted Nov. 16, 2021 in counterpart International Application No. PCT/JP2021/035167.
European Search Report dated Nov. 7, 2024, from counterpart European Patent Application No. 21 89 4324.9.

* cited by examiner (A)

OVERHEAD TRANSPORT VEHICLE AND TRANSPORT VEHICLE SYSTEM

TECHNICAL FIELD

This disclosure relates to an overhead transport vehicle and a transport vehicle system.

BACKGROUND

A known overhead transport vehicle is provided with a traveling part configured to travel on a track installed on a ceiling and the like and a lifting part including a gripping part configured to transfer an article to a transfer part such as a shelf or a load port. The lifting part is suspended and held by a plurality of suspending members such as belts, and configured to be lifted and lowered by winding or paying out the suspending members.

For example, Japanese Unexamined Patent Publication No. H10-194410 discloses an overhead transport vehicle in which fixed end positions of two double-wound suspending members (lifting belts) with respect to a drum and an unwinding angle of both suspending members extending from a winding surface of the drum are set so that accumulation of winding differences per rotation of the drum caused by deviation of timing when both suspending members shift to winding of the next layer is smaller than a predetermined value with which the lifting part (loading platform) can be held at a required horizontal degree. With the overhead transport vehicle, the winding difference between the two suspending members can be suppressed to fall within a permissible range, and the article can be horizontally gripped irrespective of a lifting height.

However, an inclination of the lifting part is caused not only by a winding timing for the next layer of the double-wound suspending members, but also by an error of a thickness of the suspending member or an error of a diameter of a winding drum. Thus, there is a demand to adjust the inclination of the lifting part more easily. As to the inclination of the lifting part, in addition to the demand to hold an article horizontally, there is also a demand to grip an article at a desired angle for the inclination of the lifting part. To cope with these demands, a configuration of appropriately adjusting the inclination of the lifting part without manual operation is necessary.

In view of this, it could be helpful to provide an overhead transport vehicle and a transport vehicle system that can appropriately adjust the inclination of the lifting part without manual operation.

SUMMARY

My overhead transport vehicle is an overhead transport vehicle in which a lifting part including a gripping part configured to grip an article is configured to be lifted and lowered by a plurality of suspending members. The overhead transport vehicle includes: a winding drum configured to lift and lower the lifting part by winding and paying out the suspending members; at least one guide roller around which the suspending members paid out from the winding drum are wound; a body part supporting the winding drum and the guide roller; at least one position adjusting part configured to move a portion of each suspending member connected to the lifting part in a lifting direction by moving a relative position of the guide roller with respect to the body part; and a control part configured to control movement of the guide roller by the position adjusting part, based on information on an inclination of the lifting part.

In the overhead transport vehicle thus configured, the inclination of the lifting part can be adjusted by causing the position adjusting part to operate. The position adjusting part is automatically adjusted based on the information on the inclination of the lifting part, and thus the lifting part can be adjusted at a desired inclination. In other words, the overhead transport vehicle can appropriately adjust the inclination of the lifting part without manual operation.

The overhead transport vehicle may further include a storage unit configured to store a movement amount of the guide roller determined based on the information on the inclination or store the information on the inclination, and the control part may control the movement of the guide roller by the position adjusting part, based on the movement amount or the information on the inclination. With this configuration, the lifting part can be adjusted at the desired inclination on the basis of information stored in the storage unit that is considered to indicate the current state of the lifting part without constantly acquiring the information on the inclination of the lifting part.

The storage unit may store the movement amount or the information on the inclination for each transfer part where the article is delivered to and from the overhead transport vehicle, and the control part may control the movement of the guide roller by the position adjusting part, based on the movement amount or the information on the inclination for each transfer part. With this configuration, the inclination of the lifting part can be adjusted at the desired inclination for each transfer part.

The overhead transport vehicle may further include an acquisition part provided to the lifting part and configured to acquire the information on the inclination. With this configuration, the inclination of the lifting part can be acquired with a simple configuration.

The overhead transport vehicle may further include an acquisition part provided to the lifting part and configured to acquire the information on the inclination, the acquisition part may periodically acquire the information on the inclination, and the storage unit may store the movement amount of the guide roller determined based on the periodically acquired information on the inclination or store the periodically acquired information on the inclination. With this configuration, the information on the inclination of the lifting part in a state close to the current one is acquired, and thus the lifting part can be appropriately adjusted at the desired inclination.

A transport vehicle system may include: the overhead transport vehicle described above; an acquisition part provided as a separate unit from the overhead transport vehicle and configured to acquire the information on the inclination; and a communication unit configured to transmit the information on the inclination acquired by the acquisition part to the overhead transport vehicle. With this configuration, the inclination of the lifting part of each overhead transport vehicle can be appropriately adjusted without manual operation, even without major modifications made to the overhead transport vehicle.

The transport vehicle system may further include a control device configured to periodically cause the overhead transport vehicle to move to a position where the acquisition part is able to acquire the information on the inclination, and the communication unit may transmit the information on the inclination periodically acquired by the acquisition part to the overhead transport vehicle. With this configuration, the information on the inclination of the lifting part in a state close to the current one is acquired, and thus the lifting part can be appropriately adjusted at the desired inclination.

Accordingly, the inclination of the lifting part can be appropriately adjusted without manual operation.

BRIEF DESCRIPTION OF THE DRAWINGS

FIGS. 13(A) and 13(B) are diagrams illustrating a procedure for acquiring the state of the overhead transport vehicle by using the maintenance scaffold.

Figure 1:
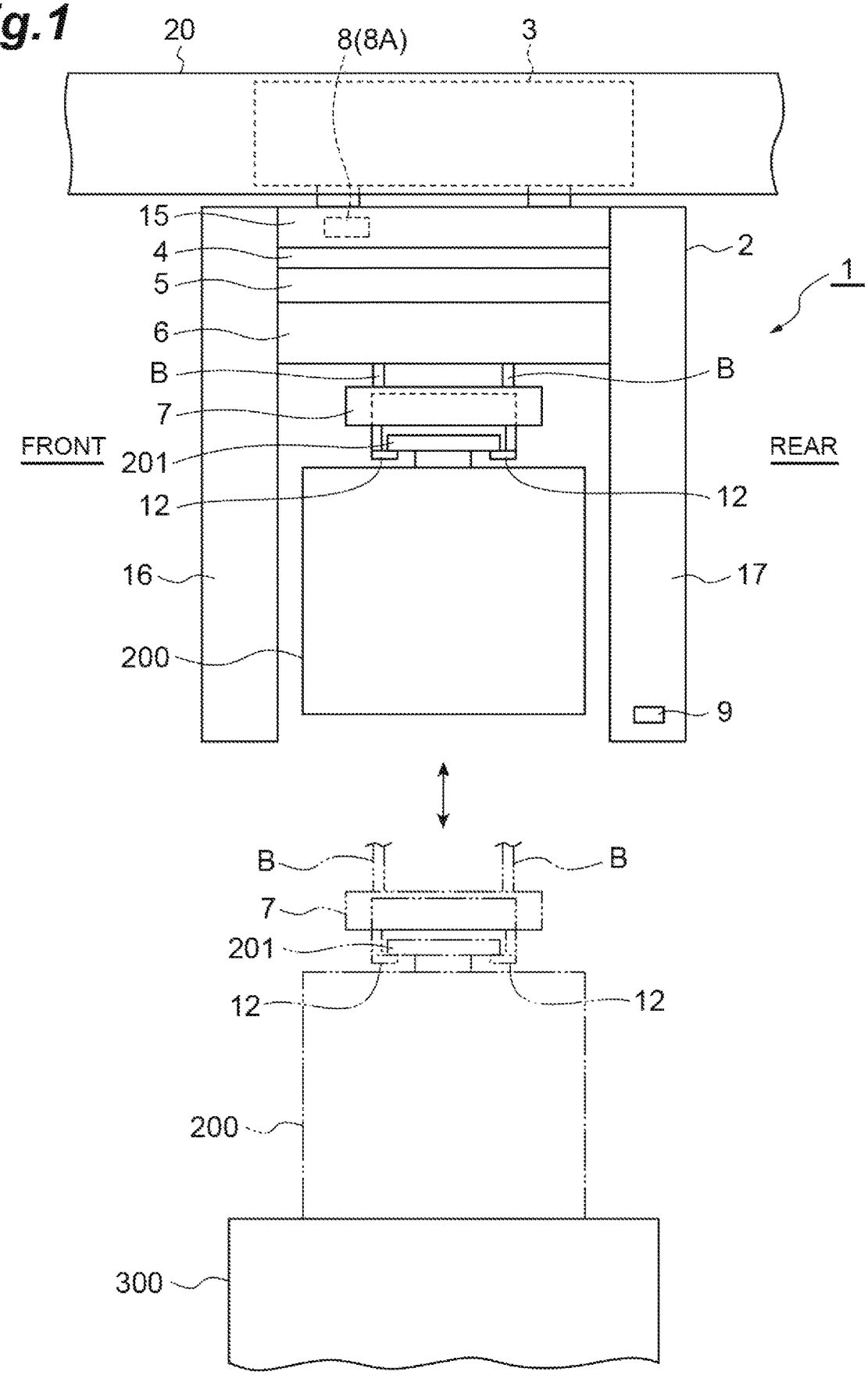
FIG. 1 is a side view of an overhead transport vehicle according to an example.

REFERENCE SIGNS LIST 1 overhead transport vehicle
7 holding unit
8 transport vehicle controller (control part)
61 base (body part)
64 third idler roller (guide roller)
65A first idler roller (guide roller)
65B second idler roller (guide roller)
67 linear motion mechanism (position adjusting part)
80 measurement unit (acquisition part)
82 unit controller
83X1, 83Y1, 83Y2, 83Z1, 83Z2, 83Z3 distance sensor
88 communication unit
90 measured unit (acquisition part)
93, 94, 95 target plate
100 transport vehicle system
110 area controller (control device)

DETAILED DESCRIPTION

A preferred example will be described in detail below with reference to the accompanying drawings. In the description of the drawings, the same elements are denoted by the same reference signs, and redundant descriptions are omitted.

Figure 8:
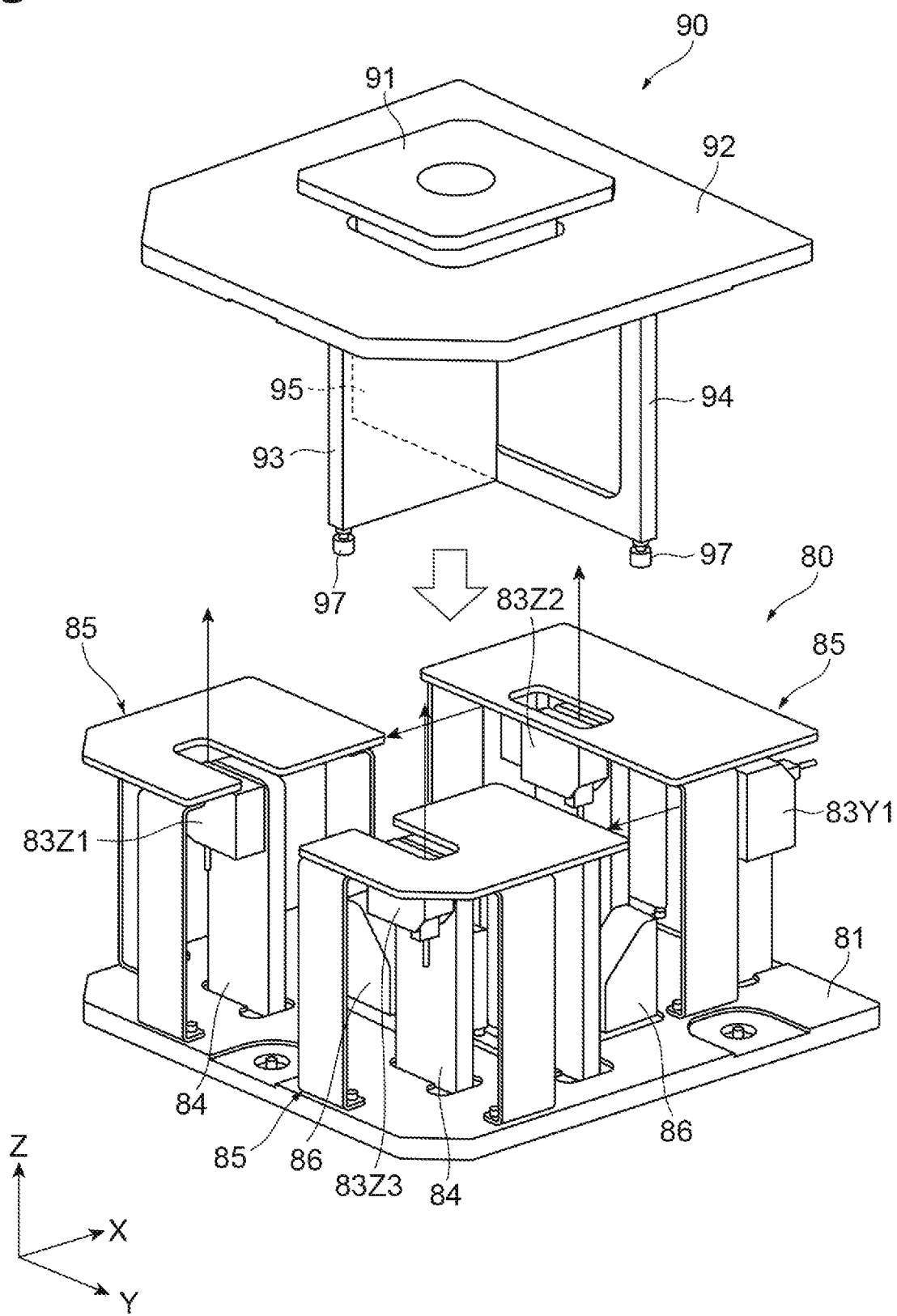
FIG. 8 is a perspective view of a measurement unit and a measured unit.

A transport vehicle system 100 of one example includes a plurality of overhead transport vehicles 1 (see FIG. 1), a track 20 (see FIG. 1) forming a travel path for the overhead transport vehicles 1, an area controller 110 (see FIG. 11), a measuring unit (acquisition part) 80 (see FIG. 11), and a measured unit (acquisition part) 90 (see FIG. 8). At least one of the overhead transport vehicles 1 includes a linear motion mechanism (position adjusting part) 67 (see FIG. 4) configured to adjust the inclination of a holding unit (lifting part) 7 with respect to the horizontal plane.

As illustrated in FIG. 1, an overhead transport vehicle 1 according to this example travels along the track 20 installed in the vicinity of a ceiling of a clean room in which semiconductor devices are manufactured. The overhead transport vehicle 1 according to this example carries a front opening unified pod (FOUP) (article) 200 housing a plurality of semiconductor wafers, and transfers the FOUP 200 to a load port (transfer part) 300 and the like provided on a processing device configured to perform various kinds of processing on the semiconductor wafers.

Figure 11:
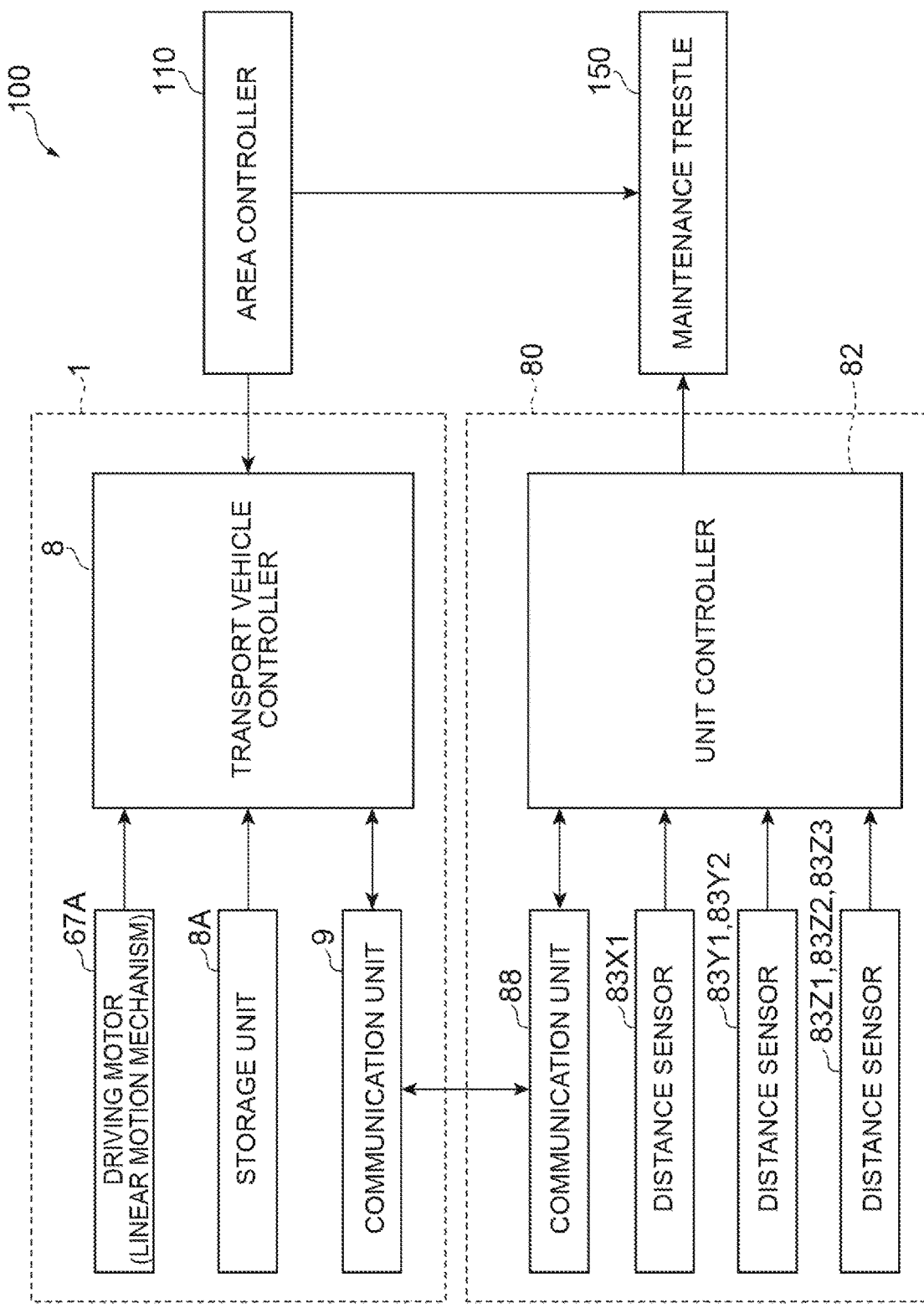
FIG. 11 is a block diagram illustrating a functional configuration of a transport vehicle system.

As illustrated in FIGS. 1 and 11, the overhead transport vehicle 1 includes a frame unit 2, a traveling unit 3, a lateral unit 4, a theta unit 5, a lifting drive unit 6, a holding unit 7, a transport vehicle controller (control part) 8, a storage unit 8A, and a communication unit 9. The frame unit 2 includes a center frame 15, a front frame 16, and a rear frame 17. The front frame 16 extends downward from an end part on a front side of the center frame 15 (front side in a traveling direction of the overhead transport vehicle 1). The rear frame 17 extends downward from an end part on a rear side of the center frame 15 (rear side in the traveling direction of the overhead transport vehicle 1).

The traveling unit 3 is disposed on an upper side of the center frame 15. For example, the traveling unit 3 travels along the track 20 by receiving electric power supplied from a high-frequency current line installed along the track 20 in a non-contact manner. The lateral unit 4 is disposed on a lower side of the center frame 15. The lateral unit 4 causes the theta unit 5, the lifting drive unit 6, and the holding unit 7 to move in a lateral direction (a lateral side in the traveling direction of the overhead transport vehicle 1). The theta unit 5 is disposed on a lower side of the lateral unit 4. The theta unit 5 turns the lifting drive unit 6 and the holding unit 7 in a horizontal plane.

The lifting drive unit 6 is disposed on a lower side of the theta unit 5. The lifting drive unit 6 causes the holding unit 7 to be lifted and lowered. The holding unit 7 is disposed on a lower side of the lifting drive unit 6. The holding unit 7 holds a flange 201 of the FOUP 200.

The transport vehicle controller 8 is disposed in the center frame 15. The transport vehicle controller 8 is an electronic control unit including a central processing unit (CPU), read-only memory (ROM), random access memory (RAM) and the like. The transport vehicle controller 8 controls respective parts of the overhead transport vehicle 1.

By way of example, the overhead transport vehicle 1 configured as described above operates as follows. When transferring the FOUP 200 to the overhead transport vehicle 1 from the load port 300, the overhead transport vehicle 1 not holding the FOUP 200 stops at a predetermined position above the load port 300. If the position of the holding unit 7 that lowers at the stop position deviates from a predetermined position with respect to the load port 300 (FOUP 200 placed on the load port 300), the horizontal position and the horizontal angle of the holding unit 7 are adjusted by driving the lateral unit 4 and the theta unit 5. If the holding unit 7 lowered by paying out the belts (suspending members) B is inclined with respect to the horizontal plane, the inclination of the holding unit 7 is adjusted by activating the linear motion mechanism 67 (see FIG. 4).

The transport vehicle controller 8 performs, based on the set values stored in the storage unit 8A, adjustments of the horizontal position and horizontal angle of the holding unit 7 and the inclination of the holding unit 7. Subsequently, the lifting drive unit 6 lowers the holding unit 7, and the holding unit 7 holds the flange 201 of the FOUP 200 placed on the load port 300. Then, the lifting drive unit 6 lifts the holding unit 7 up to a lifting end, and disposes the FOUP 200 between the front frame 16 and the rear frame 17. Subsequently, the overhead transport vehicle 1 holding the FOUP 200 starts to travel.

Meanwhile, when transferring the FOUP 200 from the overhead transport vehicle 1 to the load port 300, the overhead transport vehicle 1 holding the FOUP 200 stops at a predetermined position above the load port 300. If the position of the holding unit 7 (FOUP 200) to be lowered at the stop position deviates from the predetermined position with respect to the load port 300, the horizontal position and horizontal angle of the holding unit are adjusted by driving the lateral unit 4 and the theta unit 5. If the holding unit 7 lowered by paying out the belts B is inclined with respect to the horizontal plane, the inclination of the holding unit 7 is adjusted by activating the linear motion mechanism 67 (see FIG. 4).

The transport vehicle controller 8 performs, based on the set values stored in the storage unit 8A, adjustments of the horizontal position and horizontal angle of the holding unit 7 and the inclination of the holding unit 7. Subsequently, the lifting drive unit 6 lowers the holding unit 7, the FOUP 200 is placed on the load port 300, and the holding unit 7 releases the flange 201 of the FOUP 200. Then, the lifting drive unit 6 lifts the holding unit 7 up to the lifting end. Subsequently, the overhead transport vehicle 1 not holding the FOUP 200 starts to travel.

Figure 2:
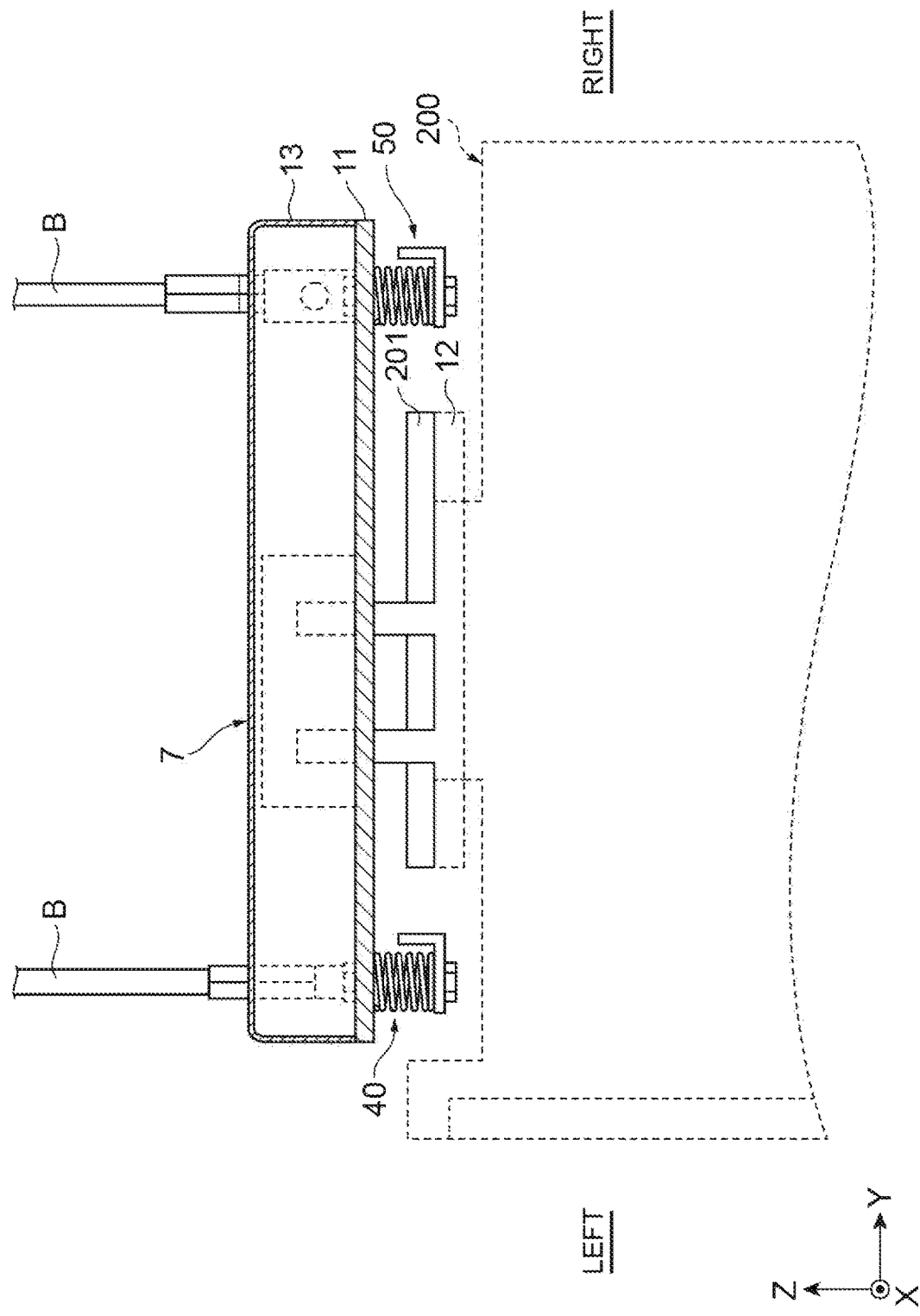
FIG. 2 is a front view of a holding unit.

Next, the following describes a configuration of the holding unit 7 in detail. As illustrated in FIGS. 1 and 2, the holding unit 7 has a base 11, a pair of grippers (gripping parts) 12 and 12, and a housing 13. The pair of grippers 12, 12 is supported by the base 11 to be openable and closeable along the horizontal direction. The pair of grippers 12, 12 is opened or closed by a driving motor (not illustrated) and a link mechanism (not illustrated). In this example, the height position of the holding unit 7 is adjusted so that the holding surfaces of the grippers 12 are lower than the height of the lower surface of the flange 201 when the pair of grippers 12, 12 is in an opened state. In this state, as the pair of grippers 12, 12 is then in a closed state, the holding surfaces of the grippers 12 advance toward the lower surface of the flange 201, and as the lifting drive unit 6 is lifted in this state, the flange 201 is held (gripped) by the pair of grippers 12, 12 and the FOUP 200 is supported. In the holding unit 7, the base 11 constitutes a bottom wall of the housing 13, and the position thereof with respect to the housing 13 is fixed.

Figure 3:
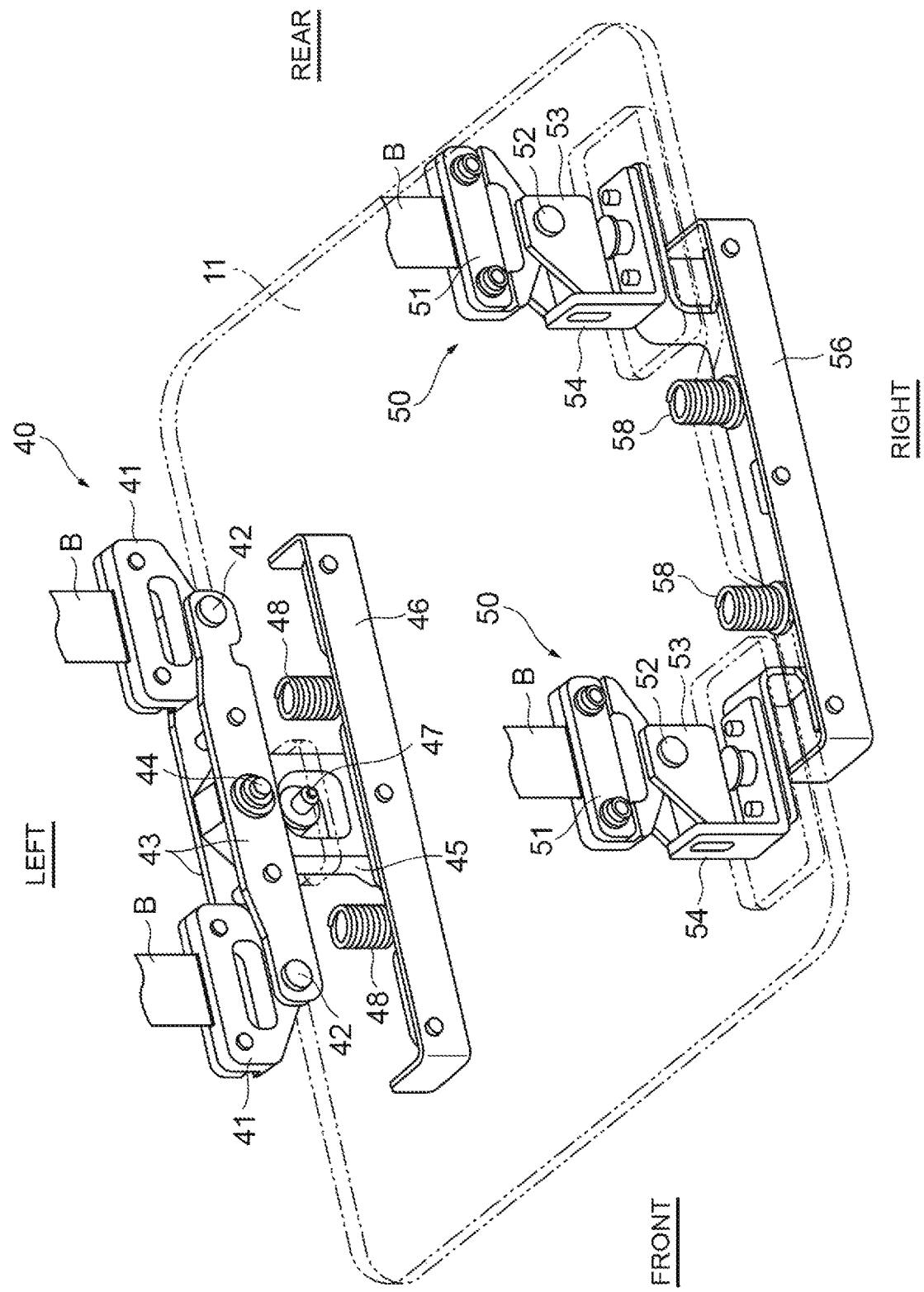
FIG. 3 is a perspective view of a first buffering mechanism and a second buffering mechanism.

As illustrated in FIG. 3, in the holding unit 7, one ends of the belts B are connected via a first buffering mechanism 50 and a second buffering mechanism 40. The following describes the first buffering mechanism 50 and the second buffering mechanism 40 in detail. The first buffering mechanism 50 and the second buffering mechanism 40 are mechanisms configured to couple the belts B to the holding unit 7 (see FIG. 1), and are mechanisms configured to prevent vibration, which is caused when the traveling unit 3 travels or the holding unit 7 is lifted or lowered, from being transmitted to the FOUP 200.

The first buffering mechanism 50 has elastic members 58 that support the base 11 to be movable vertically from below in the vertical direction, and is disposed on one side in the width direction orthogonal to the traveling direction of the overhead transport vehicle 1 in a plan view seen from the vertical direction. In this example, the first buffering mechanism 50 is provided on the right side of the holding unit 7 in the left-and-right direction. The first buffering mechanism 50 has connection members 51, swing members 53, first body members 54, a second body member 56, and a pair of the elastic members 58, 58. The left-and-right direction means the left-and-right direction when the overhead transport vehicle 1 is viewed from the front in the traveling direction.

The connection member 51 is a member attached to the belt B. The swing member 53 is a member coupled to the connection member 51. The swing member 53 is coupled to the connection member 51 to be rotatable bidirectionally via a pin member 52. The first body member 54 is a substantially L-shaped member, and the bottom part thereof is formed to be flat. The upper end of the first body member 54 is connected to the swing member 53. The bottom part of the first body member 54 is connected to the second body member 56 by a bolt and the like. The second body member 56 supports the elastic members 58 from below and also supports the bottom parts of the first body members 54.

The pair of elastic members 58, 58 are coil springs each having a predetermined spring constant. The pair of elastic members 58, 58 are supported by the second body member 56 and support the base 11 from below. The lower end of the elastic member 58 is fixed to the second body member 56. The upper end of the elastic member 58 is not fixed to the base 11, but supports the base 11 in contact. That is, each of the pair of elastic members 58, 58 urges the second body member 56 and the base 11 in a direction to be away from each other, when in a contracted state being in contact with both the second body member 56 and the base 11. The elastic member 58 has the role of reducing vibration transmitted between the members being in contact with each other. It may be fixed to the base 11 and provided to be separable from and contactable to the second body member 56.

The second buffering mechanism 40 has elastic members 48 that support the base 11 to be movable vertically from below in the vertical direction, and is disposed on the other side in the width direction (opposite side to the first buffering mechanism 50 in the width direction) that is orthogonal to the traveling direction of the overhead transport vehicle 1 in a plan view seen from the vertical direction. In this example, the second buffering mechanism 40 is provided on the left side of the holding unit 7 in the left-and-right direction. The second buffering mechanism 40 has connection members 41, 41, swing members 43, a third body member 45, a fourth body member 46, a restriction member 47, and a pair of elastic members 48, 48.

The connection members 41, 41 are members to which belts B, B are respectively attached. The swing member 43 is a member configured to couple the pair of connection members 41, 41 to the third body member 45. The pair of connection members 41, 41 and the swing members 43 are coupled to be bidirectionally rotatable and are coupled via a pair of pin members 42, 42. The swing members 43 and the third body member 45 are coupled to be bidirectionally rotatable via a pin member 44. The fourth body member 46 supports the elastic members 48, 48 from below.

The pair of elastic members 48, 48 are coil springs each having a predetermined spring constant. The pair of elastic members 48, 48 are supported by the fourth body member 46 and also support the base 11 from below. The lower end of the elastic member 48 is fixed to the fourth body member 46. The restriction member 47 restricts the base 11 from being separated from the fourth body member 46 by more than a predetermined distance. In more detail, the restriction member 47 locks the top surface of the base 11 that tries to go away from the fourth body member 46 by more than the predetermined distance. The upper end of the elastic member 48 is not fixed to the base 11, but supports the base 11 in contact. That is, each of the pair of elastic members 48, 48 urges the fourth body member 46 and the base 11 in the direction to be away from each other, when in a contracted state being in contact with both the fourth body member 46 and the base 11. The elastic member 48 has the role of reducing vibration transmitted between the members being in contact with each other. The elastic member 48 may be fixed to the base 11 and provided to be separable from and contactable to the fourth body member 46.

Although not illustrated, the holding unit 7 may be provided with a link mechanism that couples the first buffering mechanism 50 and the second buffering mechanism 40 and operates to make each of the distance between the first buffering mechanism 50 and the base 11 in the vertical direction and the distance between the second buffering mechanism 40 and the base 11 in the vertical direction closer together.

Figure 4:
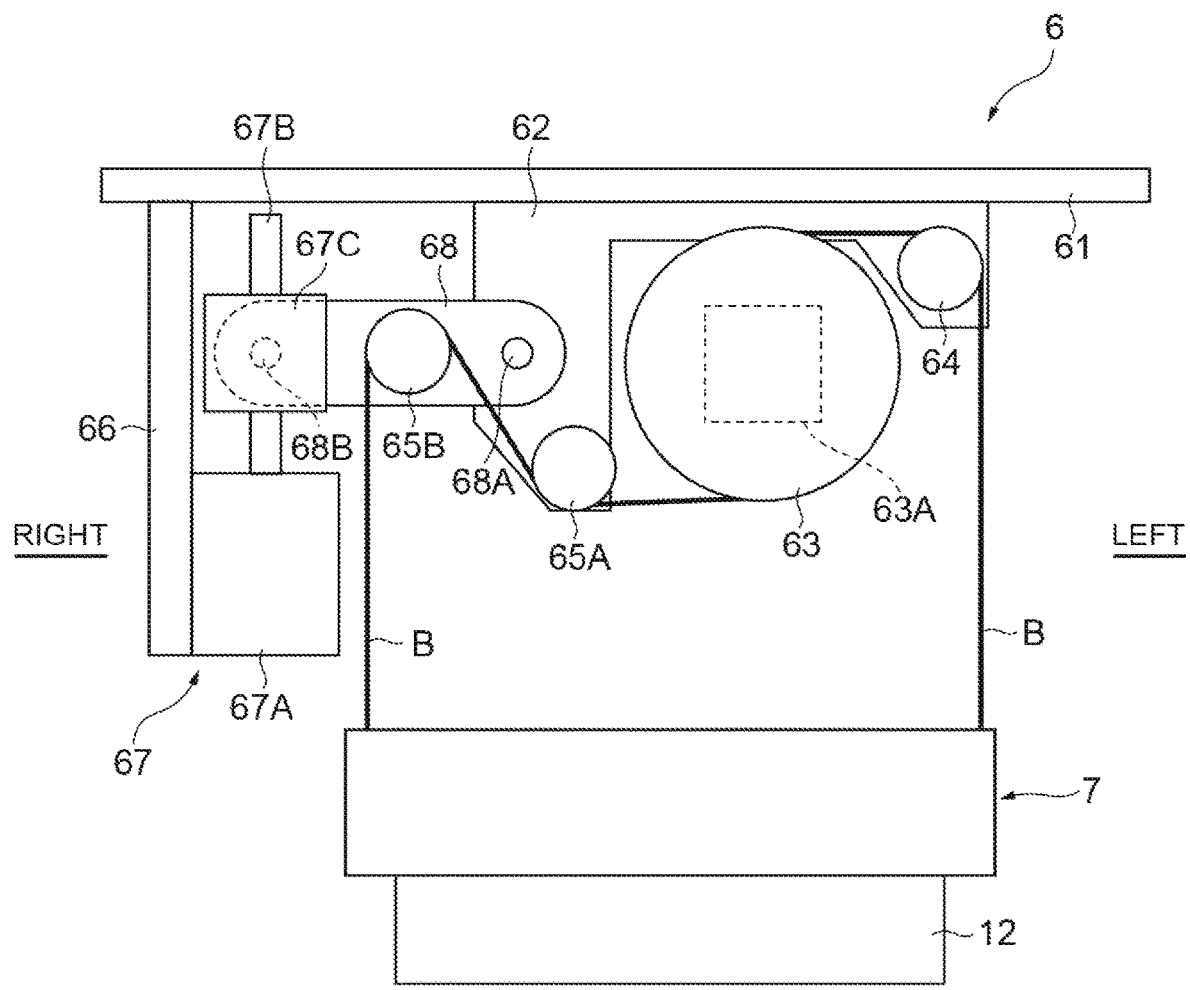
FIG. 4 is a front view of a lifting drive unit.
Figure 5:
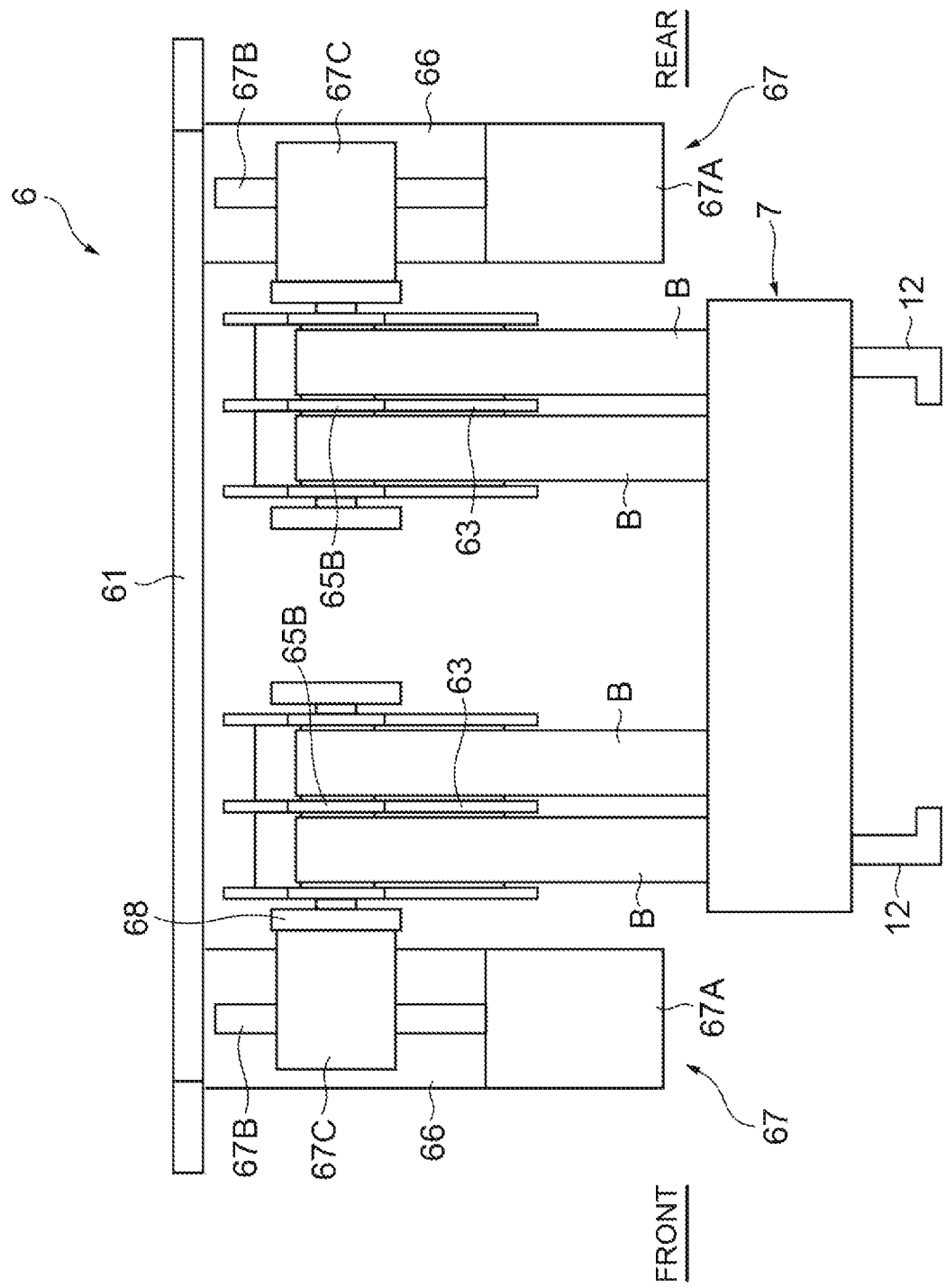
FIG. 5 is a side view of the lifting drive unit.

Next, the following describes a configuration of the lifting drive unit 6 in detail. As illustrated in FIGS. 4 and 5, the lifting drive unit 6 has a base (body part) 61, a supporting part 62, four (a plurality of) winding drums 63, a driving motor (winding drive part) 63A, first idler rollers (guide rollers) 65A, second idler rollers (guide rollers) 65B, third idler rollers (guide rollers) 64, linear motion mechanisms (position adjustment parts) 67, swing members 68, and four (a plurality of) belts B.

The base 61 supports the winding drums 63, the first idler rollers 65A, and the third idler rollers 64 via the supporting part 62. The supporting part 62 supports the four winding drums 63 in a rotatable manner. The four winding drums 63 are arranged in the front and rear direction, and winds or pays out each of the four belts B by being driven by the driving motor 63A. The supporting part 62 supports the first idler roller 65A and one end part 68A of the swing member 68 in a swingable manner.

Each of the winding drums 63 is attached to the base 61 via the supporting part 62 in a rotatable manner. The driving motor 63A is a driving source for rotating each of the winding drums 63, and fixed to the base 61. The four winding drums 63 are driven by the one driving motor 63A by being attached to a common rotating shaft (not illustrated), or by being coupled to each other via an interlocking mechanism (not illustrated).

One end of each belt B is connected to the holding unit 7, and the other end of each belt B is connected to each winding drum 63. In this example, the four belts B are provided to suspend three points of the holding unit 7. More specifically, the holding unit 7 is suspended by the four belts B. Two of the four belts B are connected to the one swing member 43 (refer to FIG. 3) that is provided in a swingable manner with respect to the holding unit 7 via the connection members 41, and the remaining two of the four belts are respectively connected to swing members 53 that are provided in a swingable manner with respect to the holding unit 7 via connection members 51.

The first idler roller 65A and the second idler roller 65B guide movement of the belt B connected to the first buffering mechanism 50. The two belts B are connected to the first buffering mechanism 50, and the first idler roller 65A and the second idler roller 65B are provided corresponding to each of the belts B. The first idler roller 65A is provided on the supporting part 62, and does not move relatively to the base 61. The second idler roller 65B is provided on the swing member 68 (described later), and moves relatively to the base 61. The configuration in which the second idler roller 65B moves relatively to the base 61 will be described at a latter stage. The third idler roller 64 guides movement of the belt B connected to the second buffering mechanism 40. The two belts B are connected to the second buffering mechanism 40, and the third idler roller 64 is provided corresponding to each of the belts B.

The linear motion mechanism 67 is a known mechanism mainly including a driving motor 67A, a screw shaft 67B, and a ball nut 67C, and configured to convert a rotational motion of the driving motor 67A into a linear motion. The linear motion mechanism 67 is fixed to the base 61 via a bracket 66. Another end part 68B of the swing member 68 is connected to the ball nut 67C, the ball nut 67C configured to move along the screw shaft 67B by being driven by the driving motor 67A. In this example, the swing member 68 swings when the ball nut 67C moves along the screw shaft 67B, and the second idler roller 65B moves relatively to the base 61 along with the swing of the swing member 68. In this way, the linear motion mechanism 67 moves the position of the second idler roller 65B so that a connection portion of the belt B (one end of the belt B) to the holding unit 7 (first buffering mechanism 50) moves in the lifting-and-lowering direction. The swing member 68 may be changed to a vertically movable member that is cantilevered by the linear motion mechanism 67, and by moving this member vertically, the position of the second idler roller 65B may be moved linearly.

Figure 6:
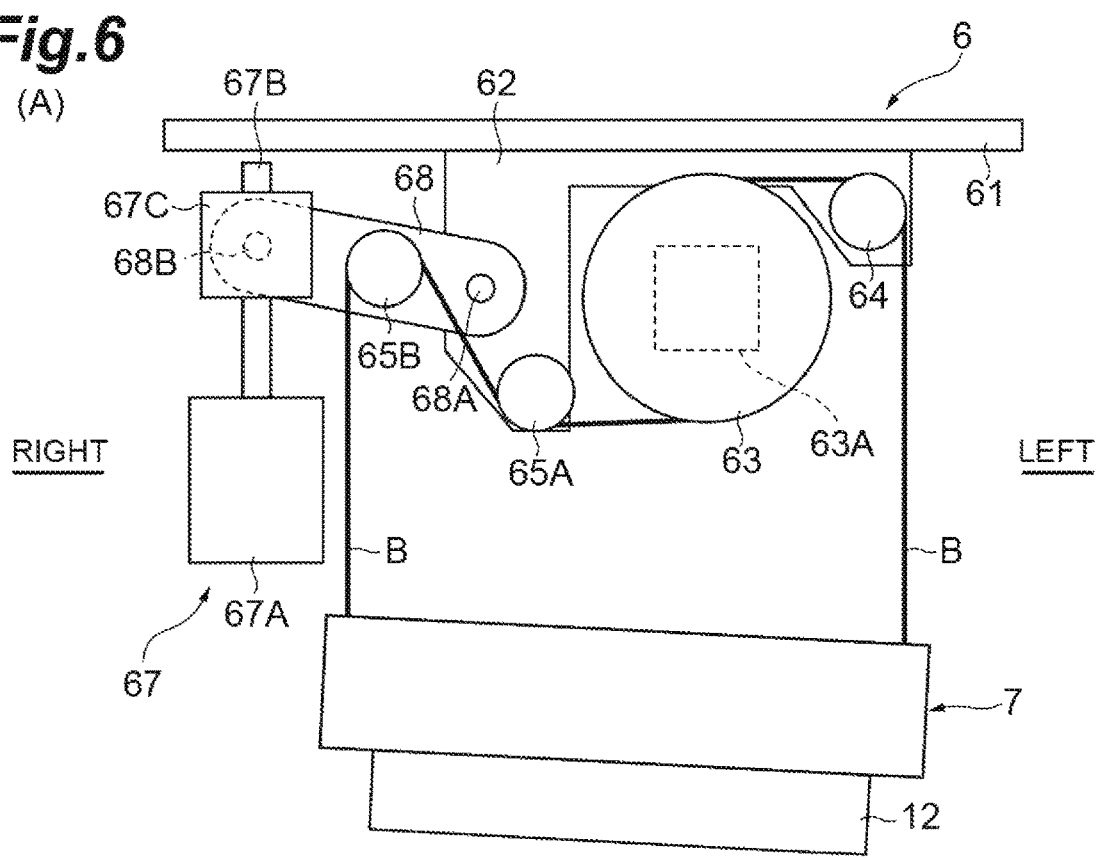
FIGS. 6(A) and 6(B) are front views illustrating operations of the lifting drive unit.
Figure 6:
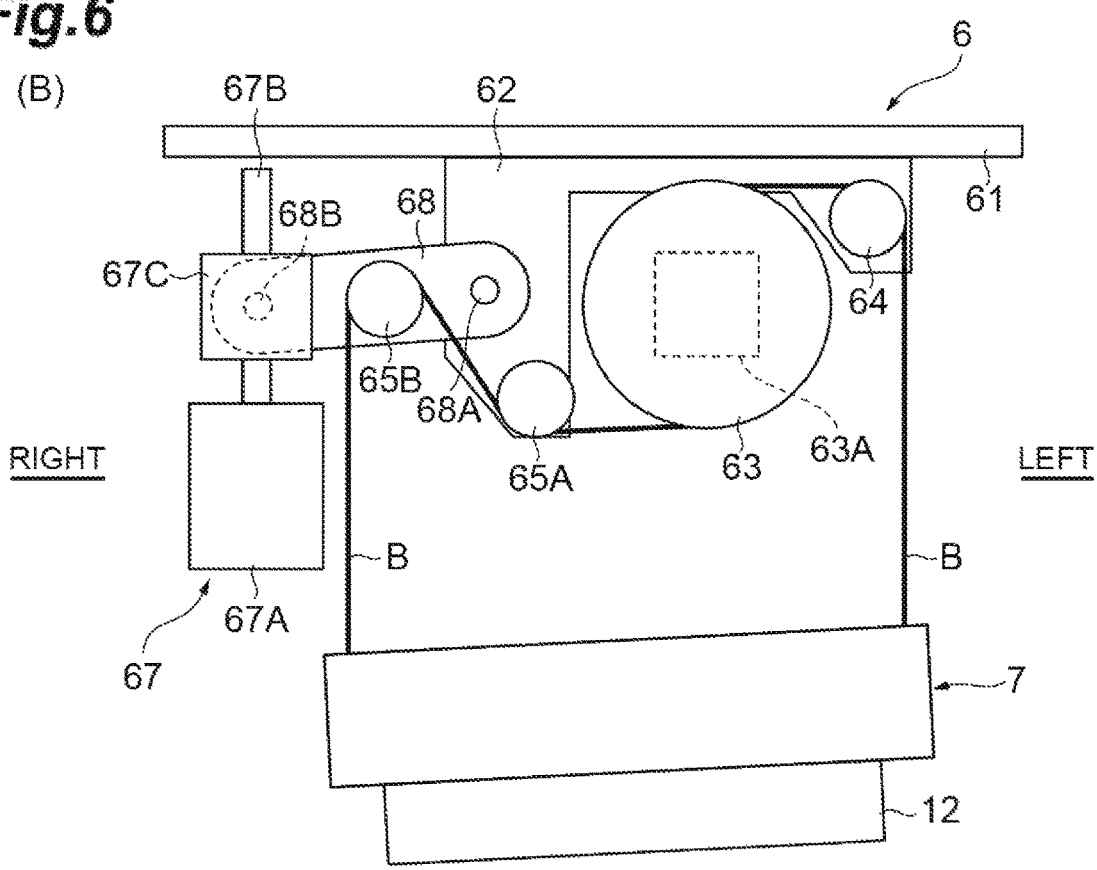

For example, as illustrated in FIG. 6(A), when both the linear motion mechanisms 67 are activated and the second idler rollers 65B are moved upward (to be closer to the base 61), the right side of the holding unit 7 can be inclined upward. For example, as illustrated in FIG. 6(B), when both the linear motion mechanisms 67 are activated and the second idler rollers 65B are moved downward (to be away from the base 61), the right side of the holding unit 7 can be inclined downward.

Figure 7:
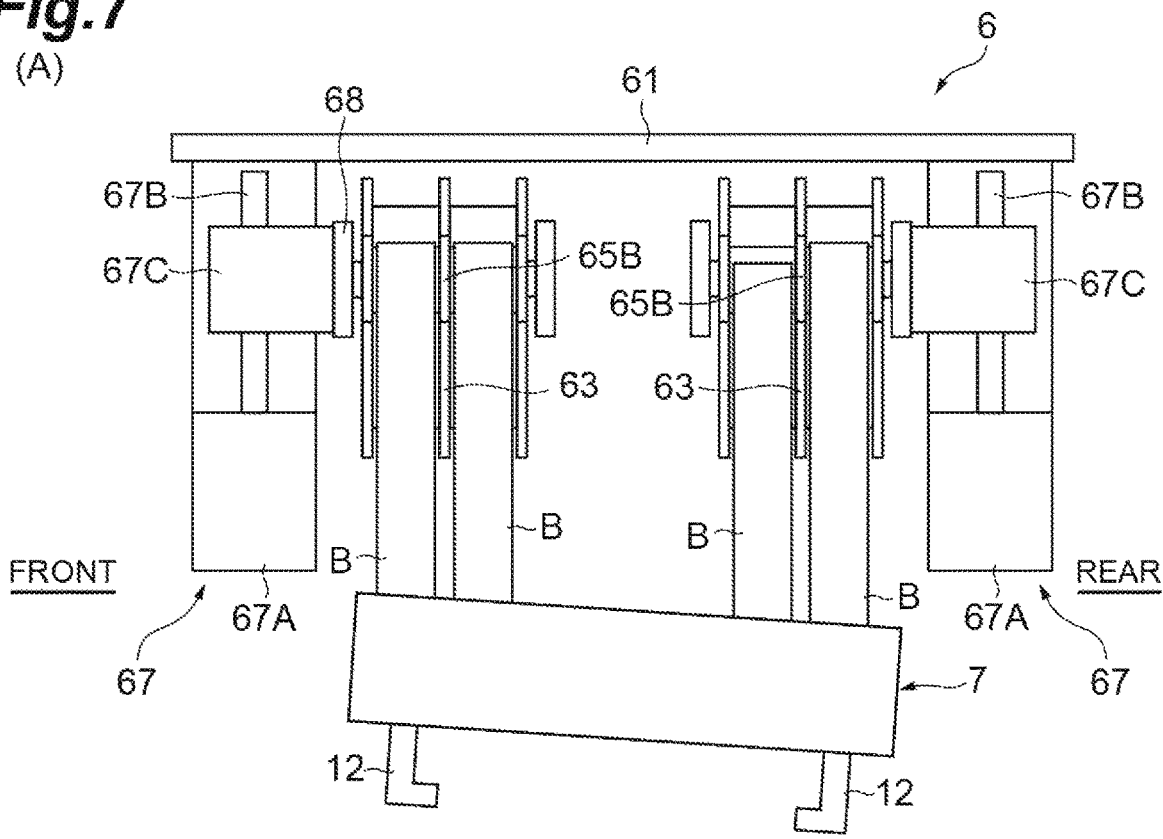
FIGS. 7(A) and (B) are side views illustrating operations of the lifting drive unit.
Figure 7:
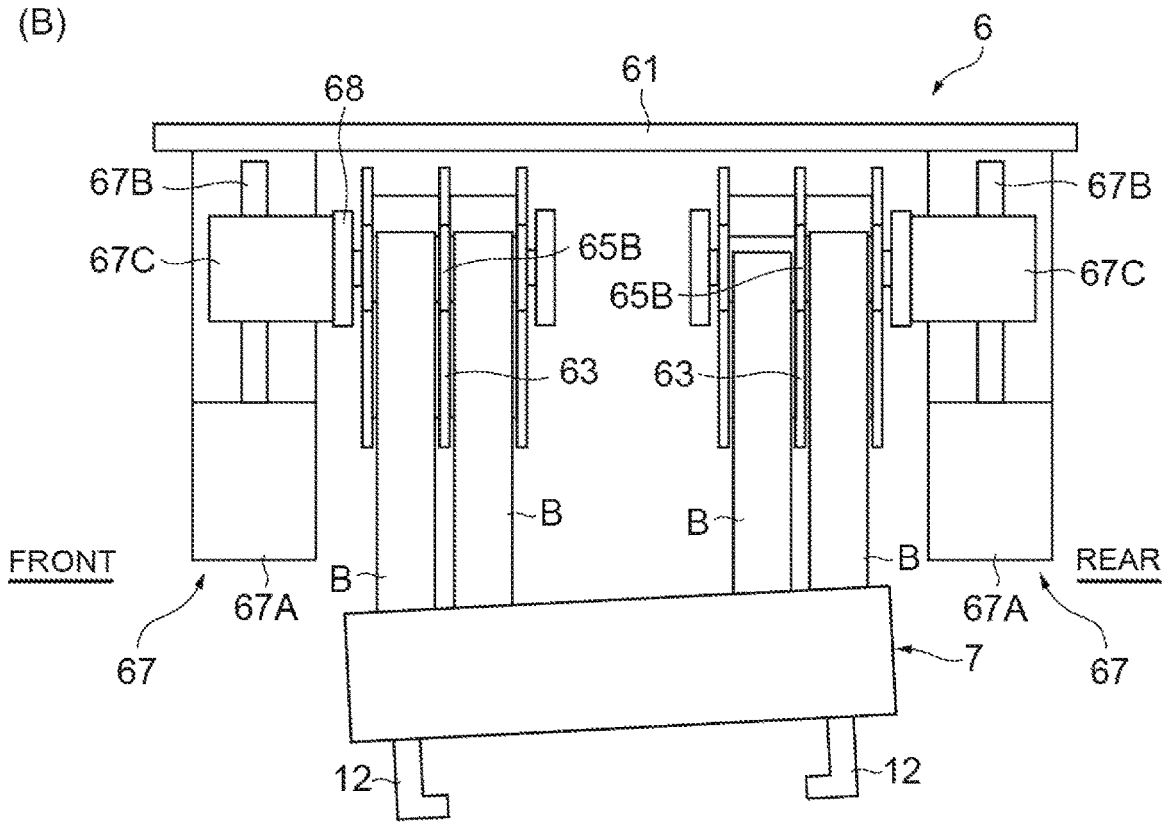

For example, as illustrated in FIG. 7(A), when one linear motion mechanism 67 (on the front side) of the two linear motion mechanisms 67 is activated and the second idler roller 65B is moved upward (to be closer to the base 61), the front side of the holding unit 7 can be inclined upward. When the front side of the holding unit 7 is desired to be inclined upward, the other linear motion mechanism 67 (on the rear side) of the two linear motion mechanisms 67 may be activated, and the second idler roller 65B may be moved downward (to be away from the base 61).

For example, as illustrated in FIG. 7(B), when the other linear motion mechanism 67 (on the rear side) of the two linear motion mechanisms 67 is activated and the second idler roller 65B is moved upward (to be closer to the base 61), the rear side of the holding unit 7 can be inclined upward. When the rear side of the holding unit 7 is desired to be inclined upward, one linear motion mechanism 67 (on the front side) of the two linear motion mechanisms 67 may be activated, and the second idler roller 65B may be moved downward (to be away from the base 61).

As in the foregoing, the overhead transport vehicle 1 can adjust, by activating both or one of the two linear motion mechanisms 67, the inclination of the holding unit 7 with respect to the horizontal plane. Furthermore, in the overhead transport vehicle 1, the operation of the linear motion mechanism 67 is controlled based on the state of the overhead transport vehicle 1 (information on inclination of the lifting part). The state of the overhead transport vehicle 1 is stored, for example, in the storage unit 8A provided in the center frame 15. The state of the overhead transport vehicle 1 includes the state of the overhead transport vehicle 1 acquired during teaching and the state of the overhead transport vehicle 1 acquired by the measuring unit 80 and the measured unit 90.

On each of the overhead transport vehicles 1, teaching is performed before the transport vehicle system 100 is put into operation. The teaching is making the overhead transport vehicle 1 store the operation to be performed such that, in order for the overhead transport vehicle 1 to transfer the FOUP 200 at the load port 300, the state of the overhead transport vehicle 1 is acquired in a state in which the overhead transfer transport 1 is stopped at a predetermined position on the track 20 and the holding unit 7 is lowered by a predetermined distance to know an amount of deviation of the position of the holding unit 7 (more precisely, the position of the grippers 12) from a target position, and based on the state of the relevant overhead transport vehicle 1, the deviation from the target position falls within an allowable range when the transport vehicle system 100 is in operation. Examples of the state of the overhead transport vehicle 1 include information such as the actual position (X coordinate, Y coordinate, Z coordinate) of the grippers 12 with the reference position of the load port 300 as the origin, the angle θ, the angle αx, the angle αy and the like.

Figure 9:
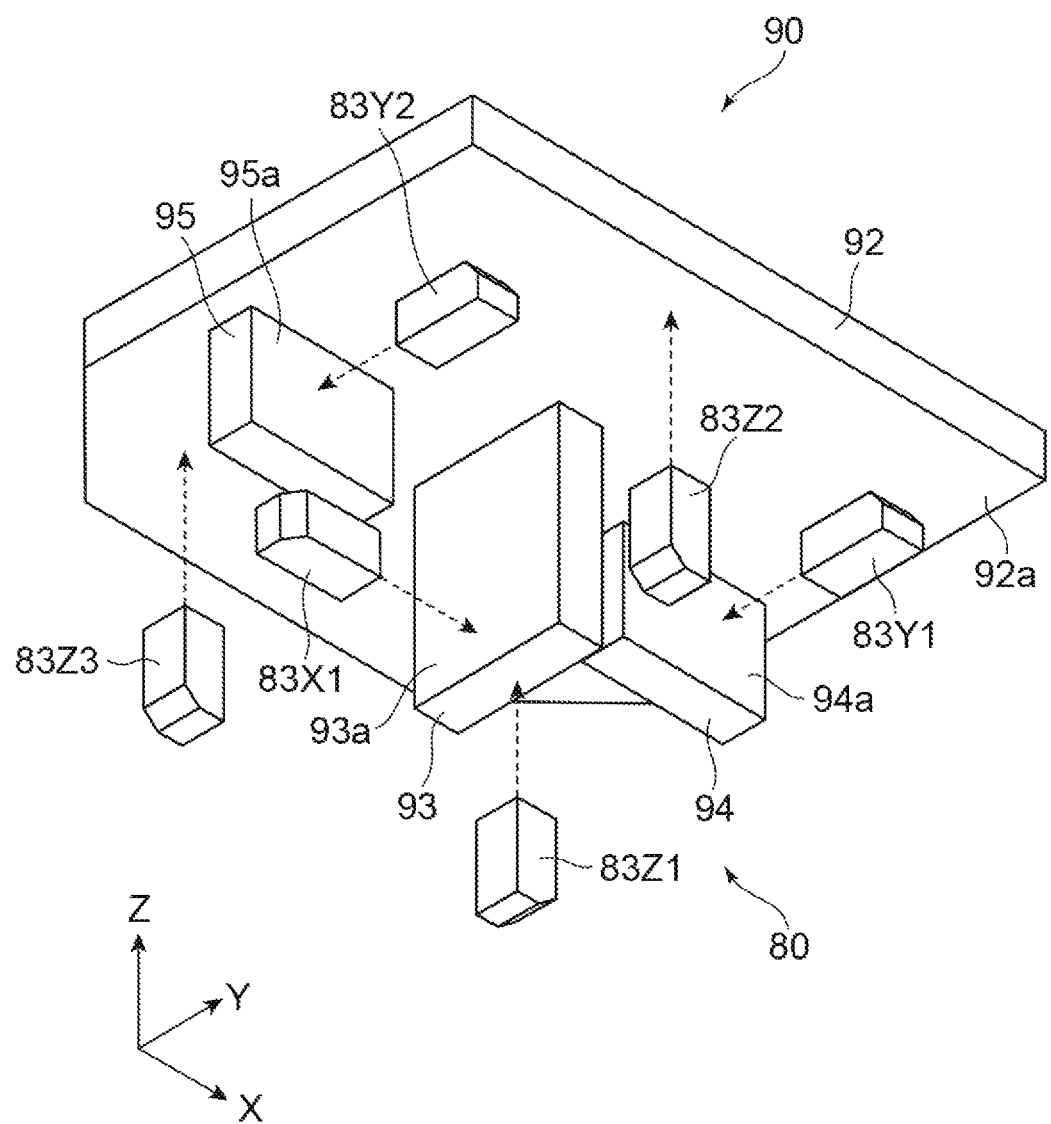
FIG. 9 is a schematic diagram illustrating objects to be measured by respective distance sensors when the measurement unit measures the measured unit.

The measuring unit 80 and the measured unit 90 are described in detail. As illustrated in FIGS. 8 and 9, the measuring unit 80 and the measured unit 90 are units for acquiring the state of the overhead transport vehicle 1 without human intervention. FIG. 8 is a perspective view of the measuring unit 80 and the measured unit 90, and FIG. 9 is a schematic diagram illustrating the measurement target of each distance sensor 83X1, 83Y1, 83Y2, 83Z1, 83Z2, 83Z3 when the measuring unit 80 measures the measured unit 90. The solid line arrows and broken line arrows illustrated in FIGS. 8 and 9 indicate the output directions of the laser at each distance sensor 83X1, 83Y1, 83Y2, 83Z1, 83Z2, and 83Z3.

In the transport vehicle system 100, when acquiring the state of the overhead transport vehicle 1, the unit measured unit 90 is mounted on the overhead transport vehicle 1 and the measuring unit 80 is mounted on the load port 300. That is, the measured unit 90 is used by being gripped by the pair of grippers 12, 12 and the measuring unit 80 is used by being placed on the load port 300. In a state in which the overhead transport vehicle 1 is stopped at a predetermined position on the track 20, the holding unit 7 is lowered by a predetermined distance, and the measured unit 90 is separated from the measuring unit 80 above the load port 300, the state of the overhead transport vehicle 1 is acquired.

The measuring unit 80 includes a body part 81, a unit controller 82 (see FIG. 11), a plurality of distance sensors 83X1, 83Y1, 83Y2, 83Z1, 83Z2, and 83Z3, mounting parts 84, support parts 85, and guide parts 86. The body part 81 is a flat plate-like member that supports the unit controller 82, the mounting parts 84, and the guide parts 86. The unit controller 82 is provided in a state of being supported by the body part 81 and performs various electrical processes in the measuring unit 80.

Each of the distance sensors 83X1, 83Y1, 83Y2, 83Z1, 83Z2, and 83Z3 is a laser-type distance sensor, for example, and is attached to the mounting parts 84. The distance sensor 83X1 measures the distance to an object by emitting a laser beam toward the inside of the body part 81 along the X-axis direction. The distance sensors 83Y1 and 83Y2 measure the distances to an object by emitting laser beams toward the inside of the body part 81 along the Y-axis direction. The distance sensors 83Z1, 83Z2, and 83Z3 measure the distances to an object by emitting laser beams upward along the Z-axis direction.

The mounting parts 84 are the portions on which each of the distance sensors 83X1, 83Y1, 83Y2, 83Z1, 83Z2, and 83Z3 is mounted, and are provided to stand on the body part 81. The support parts 85 are the portions that support the measured unit 90 and are provided to stand on the body part 81. The guide parts 86 are the portions that guide so that the measured unit 90 is positioned in a predetermined position when the measured unit 90 is supported on the support parts 85. The guide parts 86 are provided to stand on the body part 81.

The measured unit 90 has a flange 91, a base plate 92, a plurality of target plates 93, 94, and 95, and legs 97. The flange 91 is the portion provided grippable by the gripper 12. The base plate 92 is connected to the flange 91, and the target plates 93, 94, and 95 are provided to stand thereon. The base plate 92 and the target plates 93, 94, and 95 are the portions forming the target surfaces to be measured by the respective distance sensors 83X1, 83Y1, 83Y2, 83Z1, 83Z2, and 83Z3.

Each target plate 93, 94, and 95 is fixed in a predetermined place on the base plate 92. A surface 93a facing the distance sensor 83X1 in the target plate 93 is a plane perpendicular to the X-axis direction and has a predetermined positional relation with the reference position of the load port 300 (center position of the placement surface of the load port 300). A surface 94a facing the distance sensor 83Y1 in the target plate 94 and a surface 95a facing the distance sensor 83Y2 in the target plate 95 are planes perpendicular to the Y-axis direction and have a predetermined positional relation with the reference position of the load port 300. The legs 97 are provided at the bottom of each of the target plates 93, 94, and 95, and come into contact with the body part 81 of the measuring unit 80 when the measured unit 90 is supported by the measuring unit 80.

As in the foregoing, the unit controller 82 of the measuring unit 80 can acquire the measurement distance X1 by the distance sensor 83X1, the measurement distance Y1 by the distance sensor 83Y1, the measurement distance Y2 by the distance sensor 83Y2, the measurement distance Z1 by the distance sensor 83Z1, the measurement distance Z2 by the distance sensor 83Z2, and the measurement distance Z3 by the distance sensor 83Z3. Then, the unit controller 82 can, based on a plurality of measurement distances X1, Y1, Y2, Z1, Z2, and Z3, calculate the actual position (X coordinate, Y coordinate, Z coordinate) of the grippers 12 with the reference position of the load port 300 as the origin, and the angle θ, the angle αx, and the angle αy.

Figure 10:
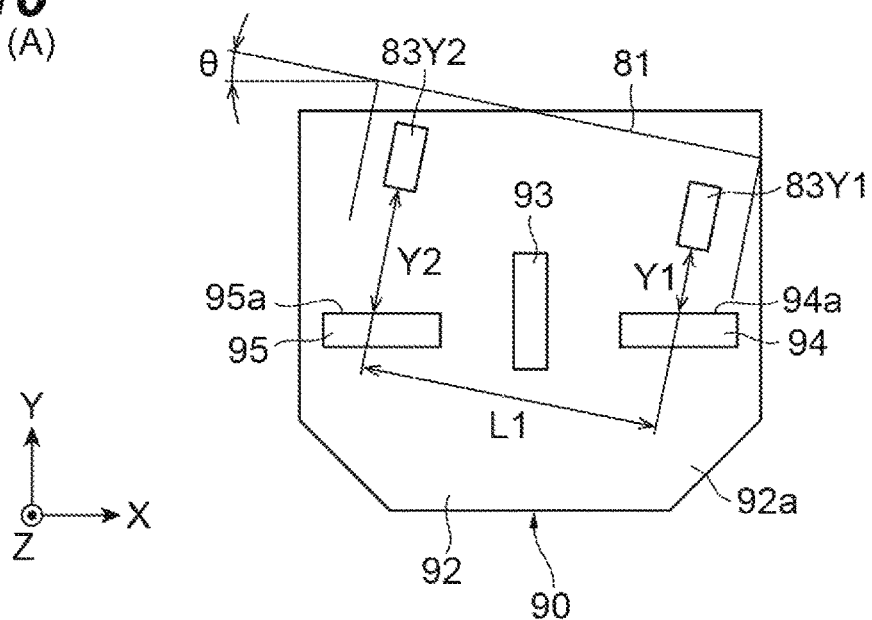
FIGS. 10(A) to 10(C) are schematic diagrams illustrating a method by which a unit controller calculates a state of the overhead transport vehicle.
Figure 10:
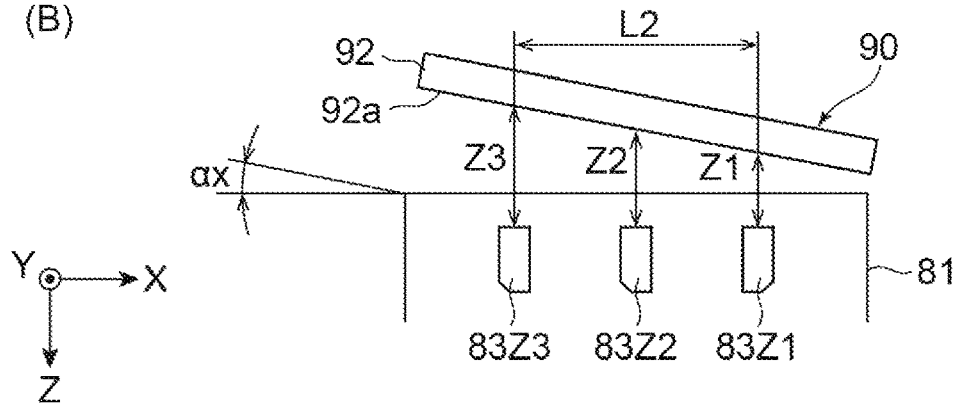
Figure 10:
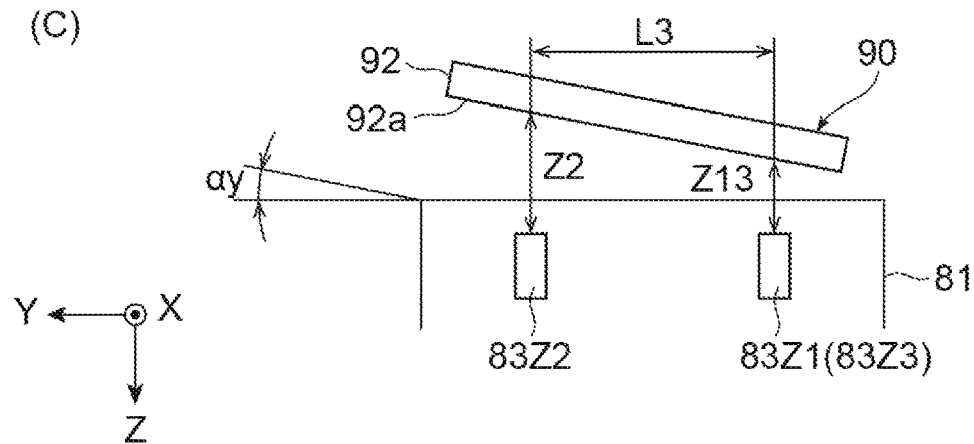

In this example, as illustrated in FIG. 10(A), the angle θ is the rotation angle of the measuring unit 80 rotating about the Z-axis with respect to the measured unit 90 (that is, the rotation angle of the gripper 12 rotating about the Z-axis with respect to the load port 300). Assuming that the distance between the distance sensor 83Y1 and the distance sensor 83Y2 is L1, the angle θ is expressed as θ=tan$^{-1}$[(Y1−Y2)/L1]. In FIG. 10(A), depiction of the distance sensors 83X1, 83Z1, 83Z2, 83Z3, and the like is omitted.

The angle αx, as illustrated in FIG. 10(B), is the tilt angle of the measuring unit 80 inclined about the Y-axis with respect to a surface 92a of the base plate 92 of the measured unit 90 (that is, the tilt angle of the gripper 12 inclined about the Y-axis with respect to the reference plane of the load port 300). Assuming that the distance between the distance sensor 83Z1 and the distance sensor 83Z3 is L2, the angle αx is expressed as αx=tan$^{-1}$[(Z3−Z1)/L2]. In FIG. 10(B), depiction of the distance sensors 83X1, 83Y1, and 83Y2 and the target plates 93, 94, 95, and the like is omitted.

The angle αy, as illustrated in FIG. 10(C), is the tilt angle of the measuring unit 80 inclined about the X-axis with respect to the surface 92a of the base plate 92 of the measured unit 90 (that is, the tilt angle of the gripper 12 inclined about the X-axis with respect to the reference plane of the load port 300). Assuming that the average value of the distance Z1 measured by the distance sensor 83Z1 and the distance Z3 measured by the distance sensor 83Z3 (that is, (Z1+Z3)/2) is Z13 and that the distance between the line connecting the distance sensor 83Z1 and the distance sensor 83Z3 and the distance sensor 83Z2 is L3, the angle αy is expressed as αy=tan=$^{-1}$ [(Z2−Z13)/L3]. In FIG. 10(C), depiction of the distance sensors 83X1, 83Y1, and 83Y2 and the target plates 93, 94, 95 and the like is omitted.

Figure 12:
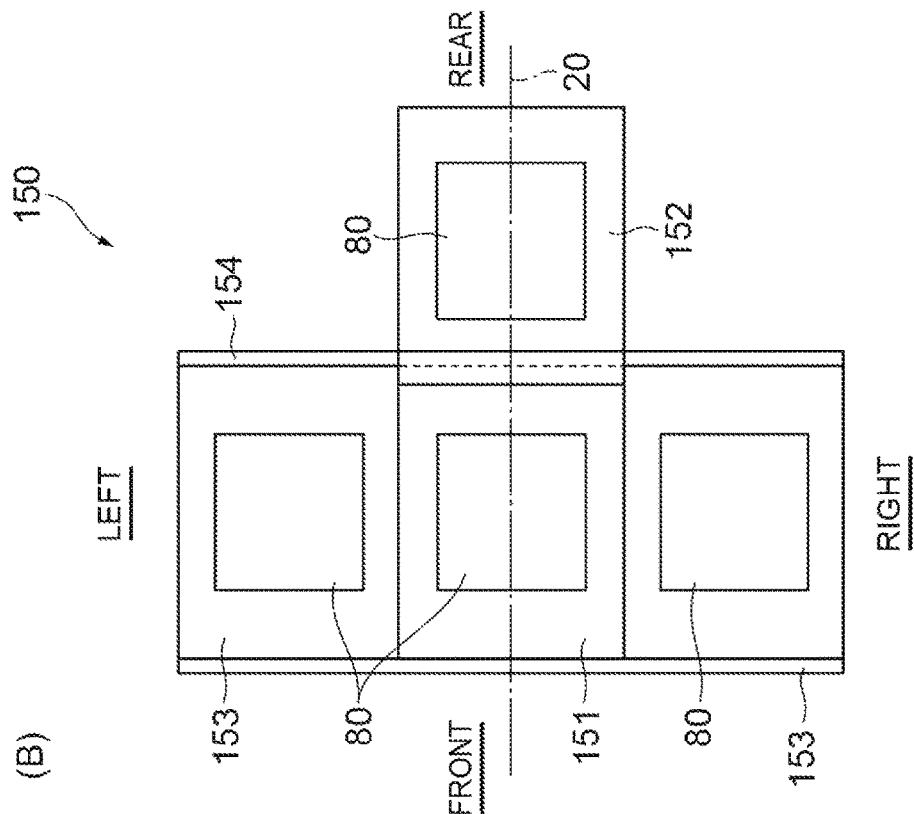
FIG. 12(A) is a side view of a maintenance scaffold.
FIG. 12(B) is a plan view of the maintenance scaffold when viewed from the direction B in FIG. 12(A).
Figure 12:
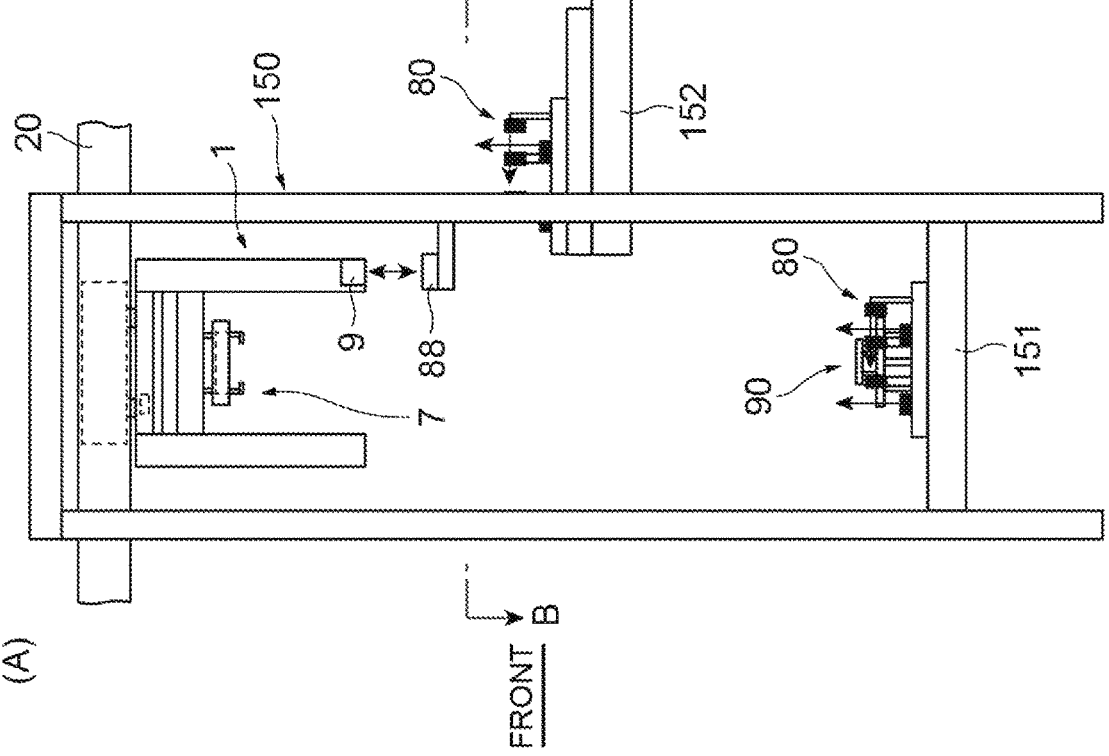

In the transport vehicle system 100, at a predetermined load port 300, in place of acquiring the actual position (X coordinate, Y coordinate, Z coordinate) of the grippers 12 with the reference position of the load port 300 as the origin, the angle θ, the angle αx, and the angle αy (also "state of the overhead transport vehicle 1"), the state of the overhead transport vehicle 1 is acquired using the measuring units 80 placed on a first placement table 151, a second placement table 152, and a pair of third placement tables 153, 153 provided on a maintenance trestle 150 illustrated in FIGS. 12(A) and 12(B) and using at least one measured unit 90.

Next, the maintenance trestle 150 is described in detail. As illustrated in FIG. 12(A), the maintenance trestle 150 is provided at a predetermined position along the track 20. The first placement table 151, the second placement table 152, and the pair of third placement tables 153, 153 are supported by a frame 154. The first placement table 151 is provided below the track 20 and at a relatively low position with respect to the second placement table 152 (in other words, at a position where the unwound amount of belts B for placing the FOUP 200 is relatively large).

The second placement platform 152 is provided below the track 20 and in a position higher than the first placement platform 151 (in other words, in a position where the paid-out length of the belts B for placing the FOUP 200 is relatively short). The second placement platform 152 is provided to be slidable in the front-and-rear direction, and is provided to be movable between an advance position located in an area above the first placement platform 151 and a retreat position not located in the area above the first placement platform 151. The retreat position is provided in a position that is displaced from the first placement platform 151 (in this example, in a position displaced rearward) in plan view when viewed from above in the vertical direction. When the second placement platform 152 is used to acquire the state of the overhead transport vehicle 1, the second placement platform 152 is moved to the advance position.

The pair of third placement platforms 153, 153 are disposed to sandwich the track 20 in plan view when viewed from above. The pair of third placement platforms 153, 153 are provided in positions to or from which the FOUP 200 cannot be transferred without causing the lateral unit 4 to operate. The pair of third placement platforms 153, 153 are fixed in a non-movable manner, unlike the second placement platform 152.

As in the foregoing, with the maintenance trestle 150 having the first placement table 151, the second placement table 152, and the pair of third placement tables 153, 153, the state of the overhead transport vehicle 1 can be acquired for each of the first placement table 151, the second placement table 152, and the pair of third placement tables 153, 153. That is, on the maintenance trestle 150, the state of the overhead transport vehicle 1 when the unwound amount of belts B is relatively large can be acquired using the first placement table 151, the state of the overhead transport vehicle 1 when the unwound amount of belts B is relatively small can be acquired using the second placement table 152, and the state of the overhead transport vehicle 1 when the belts B are unwound by activating the lateral unit 4 can be acquired using the pair of third placement tables 153, 153.

Figure 13:
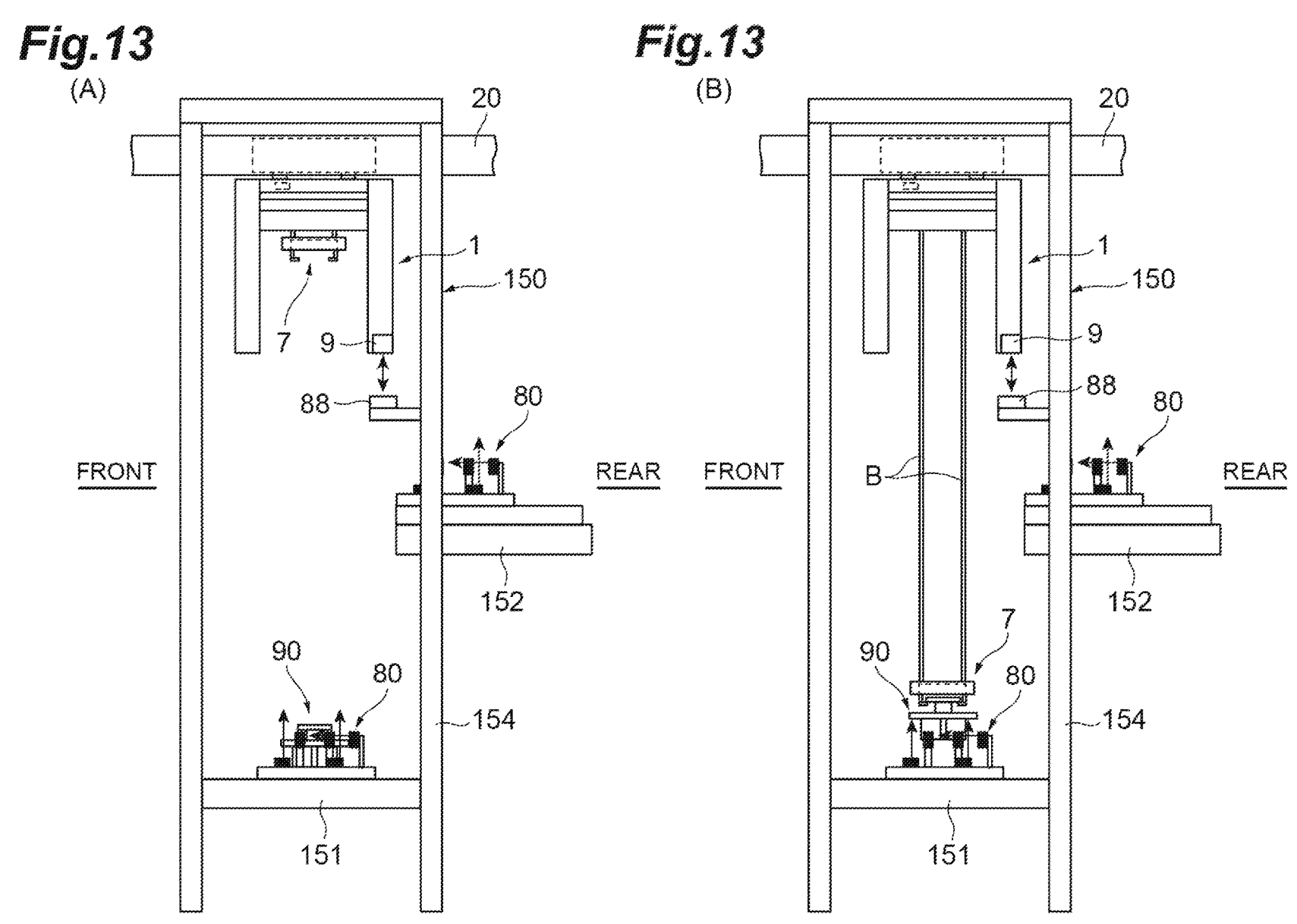

Next, using the maintenance trestle 150, a flow of acquiring the state of the overhead transport vehicle 1 is described. As illustrated in FIG. 13(A), the area controller 110 causes the overhead transport vehicle 1 to move to the maintenance trestle 150 with predetermined timing. The area controller 110 (see FIG. 11) causes the overhead transport vehicle 1 to move to the maintenance trestle 150 according to a predetermined schedule (periodically). On the first placement table 151 of the maintenance trestle 150, the measured unit 90 is placed in a state of being supported by the measuring unit 80 (see FIG. 8).

As illustrated in FIG. 13(B), the overhead transport vehicle 1 unwinds the belts B in a state of stopping above the first placement table 151 and lowers the holding unit 7. After unwinding the belts B by a predetermined amount, the overhead transport vehicle 1 activates the grippers 12 to grip the flange 91 of the measured unit 90. Thereafter, a predetermined amount of belts B is rewound and the measured unit 90 supported by the measuring unit 80 is separated from the measuring unit 80. The measuring unit 80 placed on the first placement table 151 measures, in this state, the distances X1, Y1, Y2, Z1, Z2, and Z3 to the base plate 92 and the target plates 93, 94, and 95 of the measured unit 90.

Figure 14:
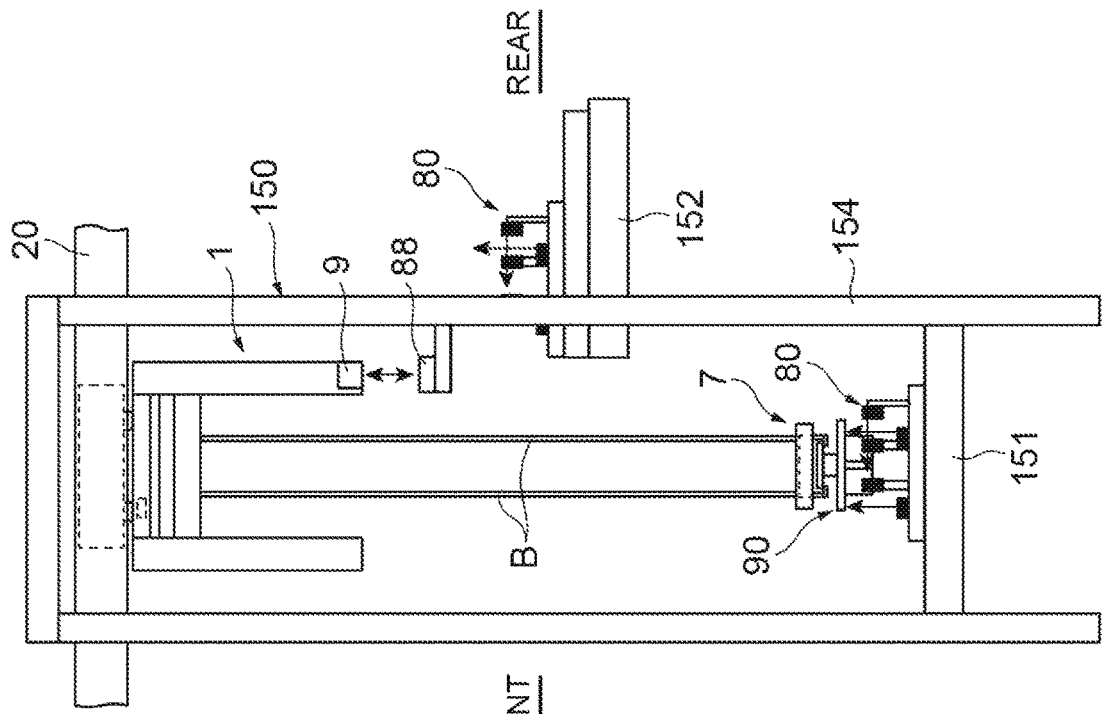
FIGS. 14(A) and 14(B) are diagrams illustrating the procedure for acquiring the state of the overhead transport vehicle by using the maintenance scaffold.
Figure 14:
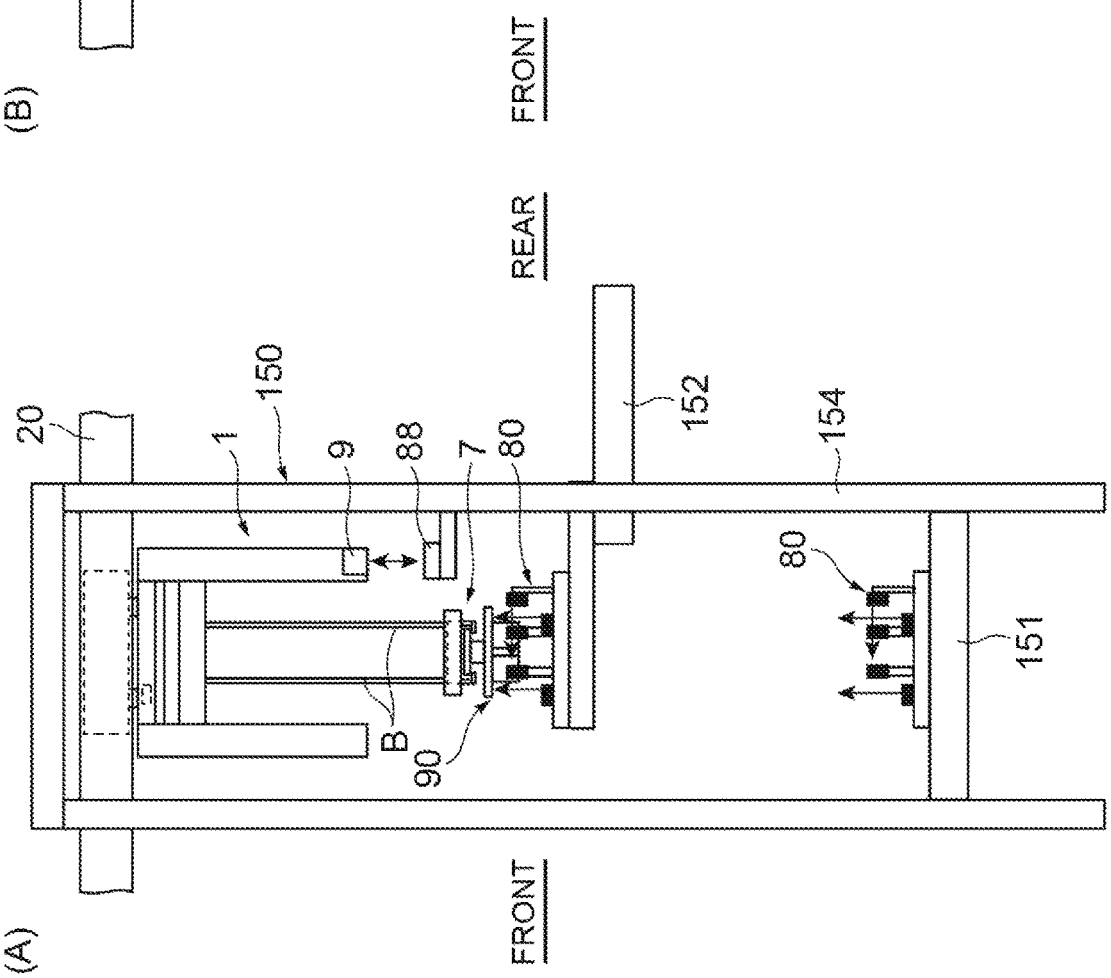

After the measurement by the measuring unit 80 placed on the first placement table 151, the overhead transport vehicle 1 winds the belts B in a state of gripping the measured unit 90, and moves the holding unit 7 to a height position higher than the second placement table 152. Next, as illustrated in FIG. 14 (A), the second placement table 152 is slid and moved to the advanced position above the first placement table 151. The overhead transport vehicle 1 unwinds the belts B and lowers the holding unit 7 holding the measured unit 90. The overhead transport vehicle 1 unwinds the belts B by a predetermined amount and positions the measured unit 90 to be in a state of being separated by a predetermined amount from the measuring unit 80 placed on the second placement table 152. The measuring unit 80 placed on the second placement table 152 measures, in this state, the distances X1, Y1, Y2, Z1, Z2, and Z3 to the base plate 92 and the target plates 93, 94, and 95 of the measured unit 90.

After the measurement by the measuring unit 80 placed on the second placement table 152, the overhead transport vehicle 1 winds the belts B in a state of gripping the measured unit 90, and then, activates the lateral unit 4 to move the holding unit 7 above one of the pair of third placement tables 153. The overhead transport vehicle 1 unwinds the belts B and lowers the holding unit 7 holding the measured unit 90. The overhead transport vehicle 1 unwinds the belt B by a predetermined amount and positions the measured unit 90 to be in a state of being separated by a predetermined amount from the measuring unit 80 placed on the one of the pair of third placement tables 153. The measuring unit 80 placed on the one of the pair of third placement tables 153 measures, in this state, the distances X1, Y1, Y2, Z1, Z2, and Z3 to the base plate 92 and the target plates 93, 94, and 95 of the measured unit 90.

After the measurement by the measuring unit 80 placed on the one of the pair of third placement tables 153, the overhead transport vehicle 1 winds the belts B in a state of gripping the measured unit 90, activates the lateral unit 4, and this time, moves the holding unit 7 above the other of the pair of third placement tables 153. The overhead transport vehicle 1 unwinds the belts B and lowers the holding unit 7 holding the measured unit 90. The overhead transport vehicle 1 unwinds the belts B by a predetermined amount and positions the measured unit 90 to be in a state of being separated by a predetermined amount from the measuring unit 80 placed on the other of the pair of third placement tables 153. The measuring unit 80 placed on the other of the pair of third placement tables 153 measures, in this state, the distances X1, Y1, Y2, Z1, Z2, and Z3 to the base plate 92 and the target plates 93, 94, and 95 of the measured unit 90.

After the measurement by the measuring unit 80 placed on the other of the pair of third placement tables 153, the overhead transport vehicle 1 winds the belts B in a state of gripping the measured unit 90, activates the lateral unit 4, and this time, moves the holding unit 7 above the first placement table 151. Next, as illustrated in FIG. 14(B), the second placement table 152 moves to the retracted position retracted from above the first placement table 151. The move to the retracted position of the second placement table 152 may be performed at an appropriate timing after the measurement by the measuring unit 80 placed on the second placement table 152.

Figure 15:
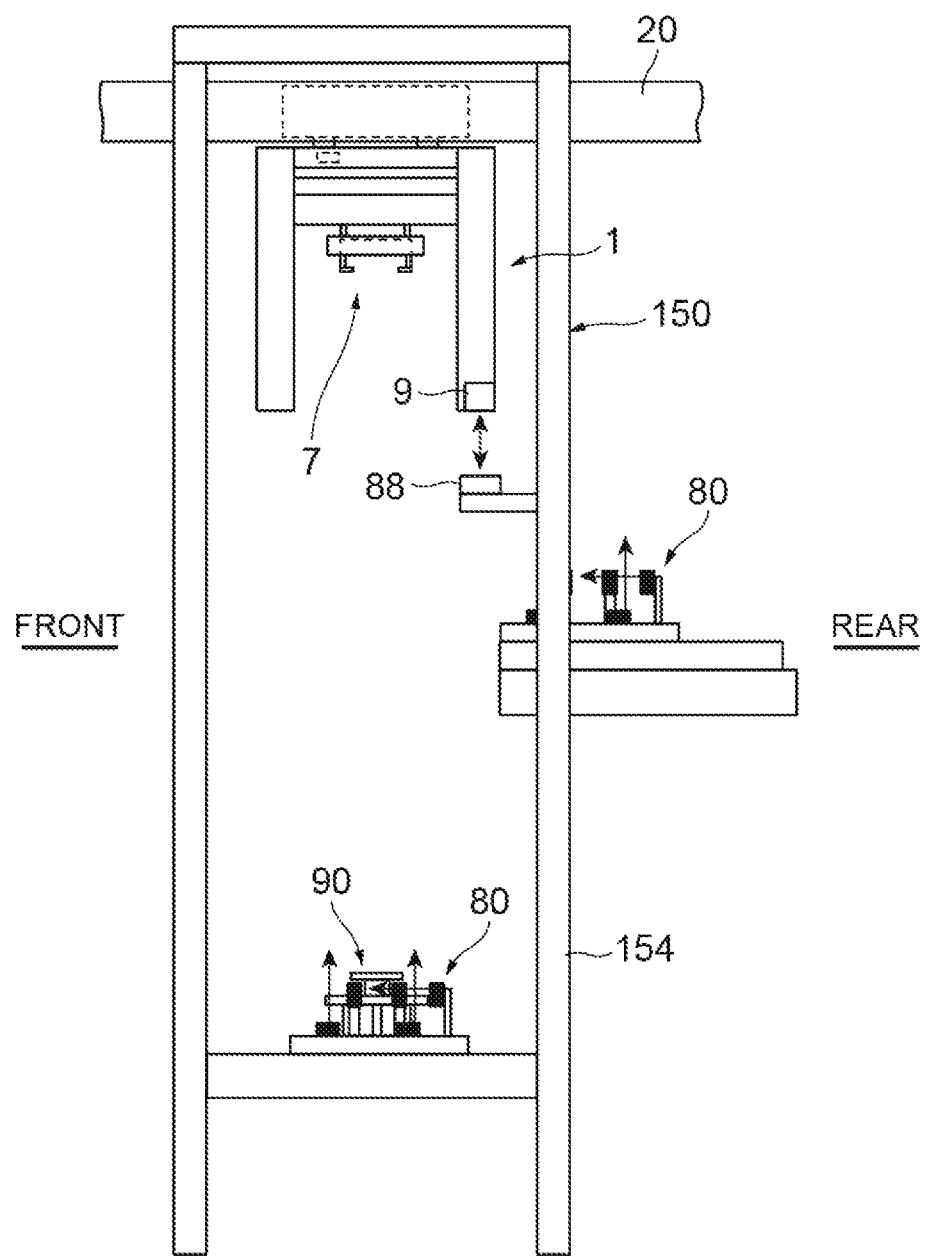
FIG. 15 is a diagram illustrating the procedure for acquiring the state of the overhead transport vehicle by using the maintenance scaffold.

The overhead transport vehicle 1 unwinds the belts B in a state of stopping above the first placement table 151 and lowers the holding unit 7 holding the measured unit 90. As illustrated in FIG. 15, the overhead transport vehicle 1 unwinds the belts B until the measured unit 90 is in a state of being supported by the measuring unit 80 placed on the first placement table 151, then activates the grippers 12 to release the gripping of the flange 91 of the measured unit 90. The measured unit 90 is in a state of being supported by the measuring unit 80 placed on the first placement table 151. Thereafter, the overhead transport vehicle 1 winds the belts B until the holding unit 7 is ready to travel. The area controller 110 causes the overhead transport vehicle 1 to leave from the maintenance trestle 150.

By the foregoing flow, on each of the measured unit 90 placed on each of the first placement table 151, the second placement table 152, and the pair of third placement tables 153, 153 at which the distances X1, Y1, Y2, Z1, Z2, and Z3 to the base plate 92 and the target plates 93, 94, and 95 have been measured, information such as the actual position (X coordinate, Y coordinate, Z coordinate) of the grippers 12 with the reference position of each of the placement tables as the origin, the angle θ, the angle αx, and the angle αy is calculated based on the distances X1, Y1, Y2, Z1, Z2, and Z3. These pieces of information are transmitted to the communication unit 9 of the overhead transport vehicle 1 via a communication unit 88 provided in the maintenance trestle 150. The communication unit 88 of the maintenance trestle 150 and the communication unit 9 of the overhead transport vehicle 1 can perform communication by appropriate means such as optical communication, wireless communication, and the like.

The transport vehicle controller 8 causes the storage unit 8A (see FIG. 11) to store the information received via the communication unit 9 such as the actual position (X coordinate, Y coordinate, Z coordinate) of the grippers 12 with the reference position of each placement table as the origin, the angle θ, the angle αx, and the angle αy. That is, the transport vehicle controller 8 causes the storage unit 8A to store (update) the latest state of the overhead transport vehicle 1 acquired by the measuring unit 80 and the measured unit 90. The transport vehicle controller 8 controls the operation of the linear motion mechanisms 67 based on the state of the overhead transport vehicle 1 stored in this storage unit 8A.

The following describes a working effect of the overhead transport vehicle 1 according to the example described above. In the overhead transport vehicle 1, by causing the linear motion mechanisms 67 to operate, the inclination of the holding unit 7 with respect to the horizontal plane can be adjusted. The actuation amount of the linear motion mechanism 67 (movement amount of the guide rollers) is automatically adjusted based on the information on the inclination of the holding unit 7, which is the state of the overhead transport vehicle 1 (information such as the angle αx and the angle αy), and thus the holding unit 7 can be adjusted at the desired inclination. In other words, the overhead transport vehicle 1 can appropriately adjust the inclination of the holding unit 7 without manual operation.

In the above transport vehicle system 100, the measurement unit 80 and the measured unit 90 as acquisition parts configured to acquire the state of the overhead transport vehicle 1 are provided as separate units from the overhead transport vehicle 1. With this configuration, the inclination of the holding unit 7 of each overhead transport vehicle 1 can be appropriately adjusted without manual operation, even without major modifications made to the overhead transport vehicle 1.

In the above transport vehicle system 100, each overhead transport vehicle 1 is periodically moved to the maintenance scaffold 150 and the state of the overhead transport vehicle 1 is periodically acquired. This allows the holding unit 7 to be appropriately adjusted at the desired inclination even if the state of the overhead transport vehicle 1 changes over time, because the state of the overhead transport vehicle 1 that is close to the current state is acquired.

The example has been described above, but one aspect of my system is not limited to the example described above. Various modifications can be made without departing from the scope of this disclosure.

First Modification

In the overhead transport vehicle 1 of the above-described example, it has been described with an example of acquiring the state of the overhead transport vehicle 1 by causing the overhead transport vehicle 1 to enter the maintenance trestle 150, but the state of the overhead transport vehicle 1 may be acquired for each load port 300 constituting the transport vehicle system 100. With this configuration, the holding unit 7 can be adjusted to the desired inclination for each load port 300 on which the FOUP 200 is actually placed.

Second Modification

In the overhead transport vehicle 1 of the above-described example and the above-described modification, it has been described with an example of acquiring the state of the overhead transport vehicle 1 from the measuring unit 80 and the measured unit 90 when the holding unit 7 grips the measured unit 90, but the state of the overhead transport vehicle 1 may be acquired by moving the holding unit 7, which is gripping the measuring unit 80, away from or closer to the measured unit 90 placed on each of the placement tables. With this configuration, the measured unit 90, which is inexpensive relative to the measuring unit 80, is placed on each of the placement tables of the maintenance trestle 150 so that the maintenance trestle 150 can be constructed at a low cost.

Third Modification

Figure 16:
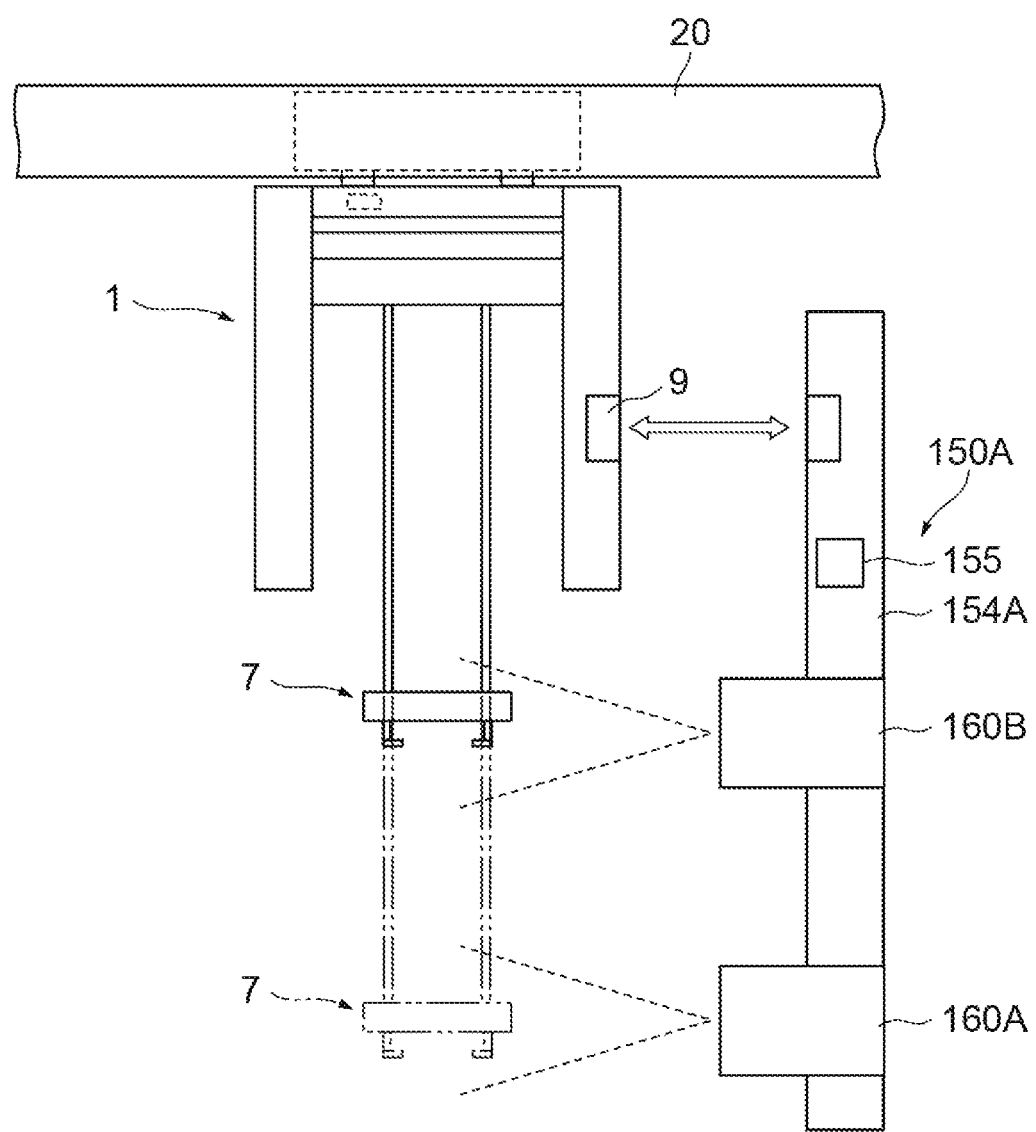
FIG. 16 is a diagram illustrating means for acquiring the state of the overhead transport vehicle according to a modification.

The overhead transport vehicle 1 according to the example and the modifications has been described above using the example in which the method of acquiring the state of the overhead transport vehicle 1 uses the measurement unit 80 and the measured unit 90. However, this disclosure is not limited to this. For example, as illustrated in FIG. 16, a maintenance scaffold 150A provided with a first camera 160A and a second camera 160B may be used to acquire the state of the overhead transport vehicle 1. For example, the maintenance scaffold 150A includes the first camera 160A provided in a position lower than that of the second camera 160B, the second camera 160B provided in a position lower than that of the first camera 160A, and a controller 155. The first camera 160A can acquire the state of the overhead transport vehicle 1 when the paid-out length of the belts B is relatively long, similarly to the measurement unit 80 provided on the first placement platform 151 described above. The second camera 160B can acquire the state of the overhead transport vehicle 1 when the paid-out length of the belts B is relatively short, similarly to the measurement unit 80 provided on the second placement platform 152 described above.

The controller 155 analyzes the state of the overhead transport vehicle 1 (e.g., the inclination of the holding unit 7) based on images captured by the first camera 160A and the second camera 160B. Analysis of the state of the overhead transport vehicle 1 can be performed, for example, by using known analysis methods such as pattern matching.

Fourth Modification

In the overhead transport vehicle 1 of the above-described example and the above-described modifications, it has been described, as the state of the overhead transport vehicle 1 to be stored in the storage unit 8A, with an example of the information such as the actual position (X coordinate, Y coordinate, Z coordinate) of the grippers 12 with a predetermined reference position as the origin, the angle θ, the angle αx, the angle αy, and the like, but it may be set values of the amount of operation of the linear motion mechanisms 67 (amount of movement of the guide rollers) determined based on such information on the actual position (X coordinate, Y coordinate, Z coordinate), the angle θ, the angle αx, the angle αy and the like.

Fifth Modification

In the above-described example and some of the above-described modifications, it has been described with an example in which the measured unit 90, which are measurement targets by the measuring unit 80, is disposed on each of the placement tables of the maintenance trestle 150, but in a configuration of the load port 300, for example, positioning pins or the like formed on a portion where the FOUP 200 is placed may be used, in place of the measured unit 90, as the measurement target of the measuring unit 80, or targets to be the measurement targets may be formed directly on each of the placement tables of the maintenance trestle 150.

Sixth Modification

The example and the modifications have been described above using the example in which the state of the overhead transport vehicle 1 is acquired by the measurement unit 80 and the measured unit 90. However, this disclosure is not limited to this. For example, in place of the measurement unit 80 and the measured unit 90, an inclination detection unit configured to acquire the inclination of the holding unit 7 with respect to the horizontal direction may be provided on the holding unit 7. Examples of the inclination detection unit include a triaxial sensor and an acceleration sensor.

Other Modifications

In the overhead transport vehicle 1 of the above-described example, in place of the linear motion mechanism 67 having the function of moving the position of at least one of the second idler rollers 65B to move one end of the belt B in the lifting-and-lowering direction, a cam mechanism (position adjustment part) having a similar function may be provided.

In the overhead transport vehicle 1 of the above-described example, it has been described with an example of moving one end of the belt B in the lifting-and-lowering direction by moving the position of at least one of the second idler rollers 65B, but it may be configured such that one end of the belt B is moved in the lifting-and-lowering direction by moving the position of the first idler roller 65A in place of the second idler roller 65B.

In the above-described example and the modifications, it has been described with an example of employing the ball screw as the linear motion mechanisms 67, but a cylinder, a linear guide, and the like may be employed.

The holding unit 7 of the above-described example and the modifications has been described with an example in which one ends of the belts B are connected via the first buffering mechanism 50 and the second buffering mechanism but it may be directly connected to the holding unit 7. The four belts B may be directly connected to the holding unit 7 as is. Alternatively, the three belts B may be connected to the holding unit 7.

In the above-described example and the modifications, it has been described with an example of direct exchange between the overhead transport vehicle 1 and the measuring unit 80 via the communication units, but various pieces of information may be exchanged via the area controller 110.

In addition to the configuration of the measuring unit 80 of the above-described example and the above-described modifications, a measuring unit including a battery and a communication unit, which are integrally configured, may be used.

The invention claimed is:

1. An overhead transport vehicle in which a lifting part including a gripping part configured to grip an article is configured to be lifted and lowered by a plurality of suspending members, the overhead transport vehicle comprising:
   a winding drum configured to lift and lower the lifting part by winding and paying out the suspending members;
   at least one guide roller around which the suspending members paid out from the winding drum are wound;
   a body part supporting the winding drum and the at least one guide roller;
   at least one position adjusting part configured to move a portion of each suspending member connected to the lifting part in a lifting direction by moving a relative position of the at least one guide roller with respect to the body part;

a control part configured to control movement of the guide roller by the at least one position adjusting part, based on information on an inclination of the lifting part; and a storage unit configured to store a movement amount of the at least one guide roller determined based on the information on the inclination or store the information on the inclination, wherein the control part controls the movement of the at least one guide roller by the at least one position adjusting part, based on the movement amount or the information on the inclination, wherein the storage unit stores the movement amount or the information on the inclination for each transfer part where the article is delivered to and from the overhead transport vehicle, and the control part controls the movement of the at least one guide roller by the at least one position adjusting part, based on the movement amount or the information on the inclination for each transfer part.

2. The overhead transport vehicle according to claim 1, further comprising an acquisition part associated with the lifting part and configured to acquire the information on the inclination.

3. The overhead transport vehicle according to claim 1, further comprising an acquisition part associated with the lifting part and configured to acquire the information on the inclination, wherein the acquisition part periodically acquires the information on the inclination, and the storage unit stores the movement amount of the at least one guide roller determined based on the periodically acquired information on the inclination or stores the periodically acquired information on the inclination.

4. A transport vehicle system comprising:

the overhead transport vehicle according to claim 1;

an acquisition part provided as a separate unit from the overhead transport vehicle and configured to acquire the information on the inclination; and a communication unit configured to transmit the information on the inclination acquired by the acquisition part to the overhead transport vehicle.

5. The transport vehicle system according to claim 4, further comprising a control device configured to periodically cause the overhead transport vehicle to move to a position where the acquisition part is able to acquire the information on the inclination, wherein the communication unit transmits the information on the inclination periodically acquired by the acquisition part to the overhead transport vehicle.

6. The overhead transport vehicle according to claim 1, further comprising an acquisition part associated with the lifting part and configured to acquire the information on the inclination.

7. The overhead transport vehicle according to claim 1, further comprising an acquisition part associated with the lifting part and configured to acquire the information on the inclination.

8. The overhead transport vehicle according to claim 1, further comprising an acquisition part associated with the lifting part and configured to acquire the information on the inclination, wherein the acquisition part periodically acquires the information on the inclination, and the storage unit stores the movement amount of the at least one guide roller determined based on the periodically acquired information on the inclination or stores the periodically acquired information on the inclination.

9. A transport vehicle system comprising:

the overhead transport vehicle according to claim 1;

an acquisition part provided as a separate unit from the overhead transport vehicle and configured to acquire the information on the inclination; and a communication unit configured to transmit the information on the inclination acquired by the acquisition part to the overhead transport vehicle.

10. The transport vehicle system according to claim 9, further comprising a control device configured to periodically cause the overhead transport vehicle to move to a position where the acquisition part is able to acquire the information on the inclination, wherein the communication unit transmits the information on the inclination periodically acquired by the acquisition part to the overhead transport vehicle.

11. A transport vehicle system comprising:

the overhead transport vehicle according to claim 1;

an acquisition part provided as a separate unit from the overhead transport vehicle and configured to acquire the information on the inclination; and a communication unit configured to transmit the information on the inclination acquired by the acquisition part to the overhead transport vehicle.

12. The transport vehicle system according to claim 11, further comprising a control device configured to periodically cause the overhead transport vehicle to move to a position where the acquisition part is able to acquire the information on the inclination, wherein the communication unit transmits the information on the inclination periodically acquired by the acquisition part to the overhead transport vehicle.

* * * * *